United States Patent
Chauhan et al.

(10) Patent No.: US 12,355,424 B2
(45) Date of Patent: Jul. 8, 2025

(54) ELECTROACOUSTIC RESONATOR

(71) Applicant: RF360 SINGAPORE PTE. LTD., Republic Plaza (SG)

(72) Inventors: Vikrant Chauhan, Petershausen (DE); Markus Mayer, Taufkirchen (DE); Stefan Ammann, Grosskarolinenfeld (DE); Manuel Sabbagh, Dorfen (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 372 days.

(21) Appl. No.: 17/934,131

(22) Filed: Sep. 21, 2022

(65) Prior Publication Data

US 2024/0097646 A1 Mar. 21, 2024

(51) Int. Cl.
*H03H 9/02* (2006.01)
*H03H 3/08* (2006.01)
*H03H 9/25* (2006.01)
*H03H 9/64* (2006.01)

(52) U.S. Cl.
CPC .......... *H03H 9/02992* (2013.01); *H03H 3/08* (2013.01); *H03H 9/25* (2013.01); *H03H 9/64* (2013.01)

(58) Field of Classification Search
CPC ......... H03H 9/02992; H03H 9/25; H03H 9/64
See application file for complete search history.

(56) References Cited

U.S. PATENT DOCUMENTS

| | | | |
|---|---|---|---|
| 4,160,963 A | 7/1979 | Hays, Jr. | |
| 7,170,372 B2 | 1/2007 | Ruile et al. | |
| 7,939,989 B2 | 5/2011 | Solal et al. | |
| 9,350,320 B2 | 5/2016 | Kishino | |
| 2007/0046400 A1* | 3/2007 | Wada | H03H 9/14532 333/196 |
| 2013/0051588 A1* | 2/2013 | Ruile | H03H 9/1457 29/25.35 |
| 2016/0126928 A1 | 5/2016 | Ruile et al. | |
| 2021/0313961 A1 | 10/2021 | Huck | |
| 2021/0344322 A1 | 11/2021 | Geselbracht et al. | |

FOREIGN PATENT DOCUMENTS

WO 2021013568 A1 1/2021

OTHER PUBLICATIONS

International Search Report and Written Opinion—PCT/SG2023/050564—ISA/EPO—Jan. 15, 2024.

* cited by examiner

*Primary Examiner* — Samuel S Outten
(74) *Attorney, Agent, or Firm* — Polsinelli

(57) ABSTRACT

Aspects of the disclosure relate to wireless communication, and high-frequency filters with resonators. One aspect is a device including first and second busbars, and electrode fingers coupled between the busbars, with electrode fingers extending different distances toward an opposite busbar such that a second end of each of the electrode fingers collectively form wave shapes. The device further includes pluralities of gap reflectors positioned between the wave shapes and a nearest busbar.

30 Claims, 16 Drawing Sheets

1200

Means for forming a layer of a piezoelectric material
1202

Means for forming an electrode structure on or above the piezoelectric material, the electrode structure comprising a first busbar; a second busbar parallel to the first busbar; a first plurality of electrode fingers coupled to the first busbar and extending in a first direction towards the second busbar without touching the second busbar, each of the first plurality of electrode fingers having a first end coupled to the first busbar and a second end, and each of the first plurality of electrode fingers extending a different distance toward the second busbar relative to adjacent electrode fingers of the first plurality of electrode fingers such that the second end of each of the first plurality of electrode fingers collectively form a first wave shape; a second plurality of electrode fingers coupled to the second busbar and extending in a second direction toward the first busbar without touching the first busbar, each of the second plurality of electrode fingers having a first end coupled to the second busbar and a second end, and each of the second plurality of electrode fingers extending a different distance toward the first busbar relative to adjacent electrode fingers of the second plurality of electrode fingers such that the second end of each of the second plurality of electrode fingers collectively form a second wave shape, wherein the first plurality of electrode fingers and the second plurality of electrode fingers are interleaved; a first plurality of gap reflectors substantially parallel to the first busbar, the first plurality of gap reflectors positioned between the first busbar and a curve associated with the second wave shape; and a second plurality of gap reflectors substantially parallel to the second busbar, the second plurality of gap reflectors positioned between the second busbar and a curve associated with the first wave shape.
1204

FIG. 12

ELECTROACOUSTIC RESONATOR

FIELD

The present disclosure relates generally to wireless communications, and in particular to high-frequency filters that can be implemented with electroacoustic resonators. For example, aspects of the present disclosure relate to the use of a wave structure at one or more ends of electrode fingers in an electroacoustic filter (e.g., to reduce performance degradation from in-device resonance).

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

SUMMARY

Aspects of the present disclosure describe elements of filter circuits for wireless communication systems. As described above, electroacoustic resonators can be used in such filter circuits. In some configurations, harmonics of such resonators can be generated incidentally to the desired performance, and such harmonics can interfere with other signals in a wireless communication apparatus. Aspects described herein include structures for suppression of such harmonics.

In one illustrative example, a wireless communication apparatus is provided. The wireless communication apparatus comprises a first busbar; a second busbar parallel to the first busbar; a plurality of electrode fingers, wherein electrode fingers coupled to the first busbar are interleaved with electrode fingers coupled to the second busbar to form an electroacoustic interdigital transducer, and wherein electrode fingers of the plurality of electrode fingers extend a different distance towards an opposite busbar such that ends of the plurality of electrode fingers nearest the opposite busbar form wave shapes; a first plurality of gap reflectors parallel to the first busbar, the first plurality of gap reflectors positioned in a first barrier region between the first busbar and the electrode fingers coupled to the second busbar; and a second plurality of gap reflectors parallel to the second busbar, the second plurality of gap reflectors positioned in a second barrier region between the second busbar and the electrode fingers coupled to the first busbar.

Another aspect is an electroacoustic resonator. The electroacoustic resonator comprises a first busbar; a second busbar parallel to the first busbar; a plurality of electrode fingers, where electrode fingers coupled to the first busbar are interleaved with electrode fingers coupled to the second busbar to form an electroacoustic interdigital transducer, and wherein adjacent electrode fingers of the plurality of electrode fingers attached to a same busbar extend a different distance towards an opposite busbar; a first plurality of gap reflectors parallel to the first busbar, the first plurality of gap reflectors positioned between the first busbar and the electrode fingers coupled to the second busbar; and a second plurality of gap reflectors parallel to the second busbar, the second plurality of gap reflectors positioned between the second busbar and the electrode fingers coupled to the first busbar.

Some such aspects are configured where the electrode fingers coupled to the first busbar each comprise a first end and a second end and extend perpendicular from the first busbar toward the second busbar, wherein the first ends are coupled to the first busbar, wherein the second ends extend perpendicular from the first busbar towards the second busbar, and wherein the second ends collectively form a wave shape. Some such aspects are configured where the wave shape is a triangle wave shape.

Another aspect is a method for forming an electroacoustic device. The method involves forming a layer of a piezoelectric material; and forming an electrode structure on or above the piezoelectric material, forming the electrode structure comprising: forming a first busbar and a second busbar; forming electrode fingers arranged in an interdigitated manner, where forming the electrode fingers comprises forming a first plurality of electrode fingers coupled to the first busbar and forming a second plurality of electrode fingers coupled to the second busbar, wherein the first plurality of electrode fingers includes electrode fingers of different lengths extending toward the second busbar such that unconnected ends of the first plurality of electrode fingers collectively form a first wave shape, wherein the second plurality of electrode fingers includes electrode fingers of different lengths extending toward the first busbar such that unconnected ends of the second plurality of electrode fingers collectively form a second wave shape; forming a first plurality of gap reflectors substantially parallel to the first busbar, the first plurality of gap reflectors positioned between the first busbar and a curve associated with the second wave shape without overlapping the second wave shape; and forming a second plurality of gap reflectors substantially parallel to the second busbar, the second plurality of gap reflectors positioned between the second busbar and a curve associated with the first wave shape without overlapping the first wave shape.

Such aspects can operate where forming the electrode structure further comprises forming a first trap by forming first weighted sections where the electrode fingers are positioned on the first wave shape; and forming a second trap by forming second weighted sections where the electrode fingers are positioned on the second wave shape.

Such aspects can operate where the first weighted sections and the second weighted sections are formed with an additional finger width. Such aspects can operate where the first weighted sections and the second weighted sections are formed with material from a dielectric layer.

Another aspect is an electroacoustic resonator. The electroacoustic resonator comprises a first busbar; a second busbar parallel to the first busbar; a first plurality of electrode fingers coupled to the first busbar and extending in a first direction towards the second busbar without touching the second busbar, each of the first plurality of electrode fingers having a first end coupled to the first busbar and a second end, and each of the first plurality of electrode fingers extending a different distance toward the second busbar relative to adjacent electrode fingers of the first plurality of electrode fingers such that the second end of each of the first plurality of electrode fingers collectively form a first wave shape; a second plurality of electrode fingers coupled to the second busbar and extending in a second direction toward the first busbar without touching the first busbar, each of the second plurality of electrode fingers having a first end coupled to the second busbar and a second end, and each of the second plurality of electrode fingers extending a different distance toward the first busbar relative to adjacent electrode fingers of the second plurality of electrode fingers such that the second end of each of the second plurality of electrode fingers collectively form a second wave shape, wherein the first plurality of electrode fingers and the second plurality of electrode fingers are interleaved; a first plurality of gap reflectors substantially parallel to the first busbar, the first plurality of gap reflectors positioned between the first busbar and a curve associated with the second wave shape; and a second plurality of gap reflectors substantially parallel to the second busbar, the second plurality of gap reflectors positioned between the second busbar and a curve associated with the first wave shape.

Some such aspects can be structured where the first plurality of electrode fingers comprise a first weighted section proximate to the first end of each of the first plurality of electrode fingers; and the second plurality of electrode fingers comprise a second weighted section proximate to the first end of each of the second plurality of electrode fingers.

Some such aspects can be structured where the first weighted section proximate to the first end of each of the first plurality of electrode fingers is positioned on the curve associated with the second wave shape; and the first weighted section proximate to the first end of each of the second plurality of electrode fingers is positioned on the curve associated with the first wave shape.

Some such aspects can be structured where each electrode finger of the first plurality of electrode fingers comprises a second weighted section at the second end; and each electrode finger of the second plurality of electrode fingers comprises the second weighted section at the second end.

Some such aspects can be structured where the first weighted section and the second weighted section of each of the first plurality of electrode fingers and the first weighted section and the second weighted section of each of the second plurality of electrode fingers each comprise a respective area of additional thickness compared with a respective center track portion of each corresponding electrode finger.

Some such aspects can be structured where the first weighted section and the second weighted section of each of the first plurality of electrode fingers and the first weighted section and the second weighted section of each of the second plurality of electrode fingers each comprise a respective area of additional finger width compared with a respective center track portion of each corresponding electrode finger.

Some such aspects can be structured where the curve associated with the first wave shape comprises a cosine curve; and wherein the curve associated with the second wave shape comprises a sine curve. Some aspects can be structured where the curve associated with the first wave shape and the curve associated with the second wave shape each comprises at least one of a cosine curve or a sine curve; and wherein the curve associated with the first wave shape is offset from the curve associated with the second wave shape to provide a difference in aperture (e.g., overlapping finger length).

Some such aspects can be structured where a period of the curve associated with the first wave shape and a period of the curve associated with the second wave shape each include a number of electrode fingers from 10 to 50.

Some such aspects can further include a first weighted section defined by a dielectric layer or first trimmed segments proximate to the first end of each of the first plurality of electrode fingers; and a second weighted section defined by the dielectric layer or second trimmed segments proximate to the first end of each of the second plurality of electrode fingers.

Some such aspects can be structured where the first plurality of gap reflectors each comprise a metal bar parallel to the first busbar and transverse across the first plurality of electrode fingers and coupled to at least a portion of the first plurality of electrode fingers; and the second plurality of gap reflectors each comprise a metal bar parallel to the second busbar and transverse across the second plurality of electrode fingers and coupled to at least a portion of the second plurality of fingers.

Some such aspects can further include a first end reflector at a first track end, the first end reflector comprising reflector fingers extending in a perpendicular direction from the first busbar to the second busbar; a third plurality of electrode fingers coupled to the first busbar between the first plurality of electrode fingers or the second plurality of electrode fingers and the first end reflector, the third plurality of electrode fingers extending in the perpendicular direction towards the second busbar without touching the second busbar; a fourth plurality of electrode fingers coupled to the second busbar between the first plurality of electrode fingers or the second plurality of electrode fingers and the first end reflector, the fourth plurality of electrode fingers extending in the perpendicular direction towards the first busbar without touching the first busbar, wherein the third plurality of electrode fingers are interleaved with the fourth plurality of electrode fingers where the third plurality of electrode fingers each further comprise a first weighted section, wherein each first weighted section of the third plurality of electrode fingers is approximately equidistant along a corresponding electrode finger from the first busbar; and the fourth plurality of electrode fingers each further comprise a first weighted section, wherein each first weighted section of the fourth plurality of electrode fingers is approximately equidistant along the corresponding electrode finger from the second busbar.

Some such aspects can be structured where the first plurality of gap reflectors comprises gap reflectors having different lengths and/or where the different lengths of the first plurality of gap reflectors is defined by the curve associated with the second wave shape.

In some aspects, the apparatuses described above can include a mobile device with a camera for capturing one or more pictures. In some aspects, the apparatuses described above can include a display for displaying one or more pictures. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

FIG. 12 is a functional block diagram of at least a portion of an example of a simplified wireless transceiver circuit in which the filter circuits and associated split resonators may be employed.

DETAILED DESCRIPTION

Figures 1A, 1B:
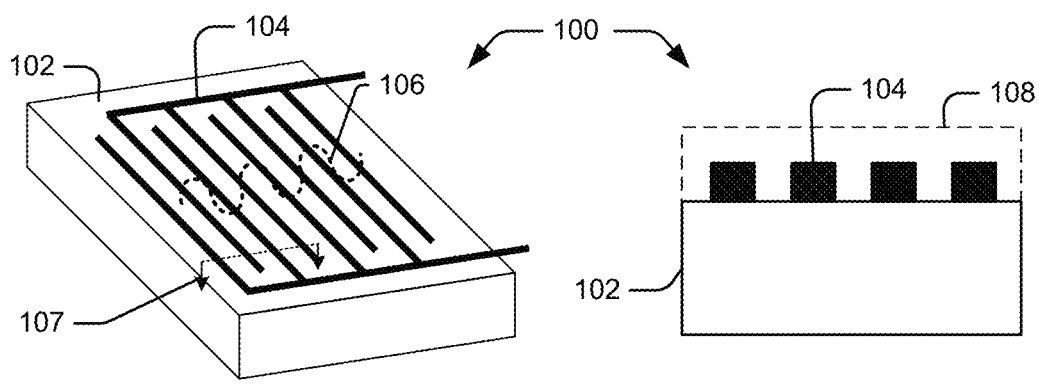
FIG. 1A is a diagram of a perspective view of an example of an electroacoustic device.
FIG. 1B is a diagram of a side view of the electroacoustic device of FIG. 1A.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Electroacoustic devices such as surface acoustic wave (SAW) resonators, which employ electrode structures on a surface of a piezoelectric material, are being designed to cover more frequency ranges (e.g., 500 MHz to 6 GHz), to have higher bandwidths (e.g., up to 25%), and to have improved efficiency and performance as designs using such devices become more complex. Additionally, such devices can be included in systems that support transmission, reception, and multiple channels at different frequencies within the same wireless communication apparatus. During operation, such SAW resonators can generate harmonics (e.g., second and third order harmonic signals of a prime signal). Such harmonics can be propagated through parasitic paths to interfere with signals on other signal paths (e.g., a second order harmonic of a signal in a transmission path resonator interfering with a signal in a SAW or bulk acoustic wave (BAW) receive path resonator).

Aspects described herein include structures within SAW resonators that can suppress certain harmonics using adjusted structures within a harmonic resonator, including a wave structure at ends of the electrode fingers that are part of a SAW resonator, as well as additional gap reflectors around the wave structures (e.g., perpendicular to the line of the electrode fingers at or around the electrode finger ends having the wave structure).

Various aspects of the application will be described with respect to the figures.

FIG. 1A is a diagram of a perspective view of an example of an electroacoustic device 100. The electroacoustic device 100 may be configured as or be a portion of a SAW resonator. In certain descriptions herein, the electroacoustic device 100 may be referred to as a SAW resonator. However, there may be other electroacoustic device types (e.g., BAW or TFBAR) that may be constructed based on the principles described herein. The electroacoustic device 100 includes an electrode structure 104, that may be referred to as an interdigital transducer (IDT), on the surface of a piezoelectric material 102. The electrode structure 104 generally includes first and second comb shaped electrode structures (conductive and generally metallic) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars). In various examples, circuits described herein having such structures can include micro-electroacoustic filters implemented with micro-electromechanical structure (MEMS) technology. MEMS technology includes miniature physical structures that can have both mechanical (e.g., vibrational or acoustic) component characteristics as well as electrical characteristics. In some examples, the resonators described herein can be built using MEMS fabrication techniques to generate structures with dimensions less than one micrometer.

FIG. 1B is a diagram of a side view of the electroacoustic device 100 of FIG. 1A along a cross-section 107 shown in FIG. 1A. The electroacoustic device 100 is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobate (LiNbO3), doped variants of these, or other piezoelectric materials. It should be appreciated that more complicated layer stacks including layers of various materials may be possible within the stack. For example, optionally, a temperature compensation layer 108 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

Figure 2A:
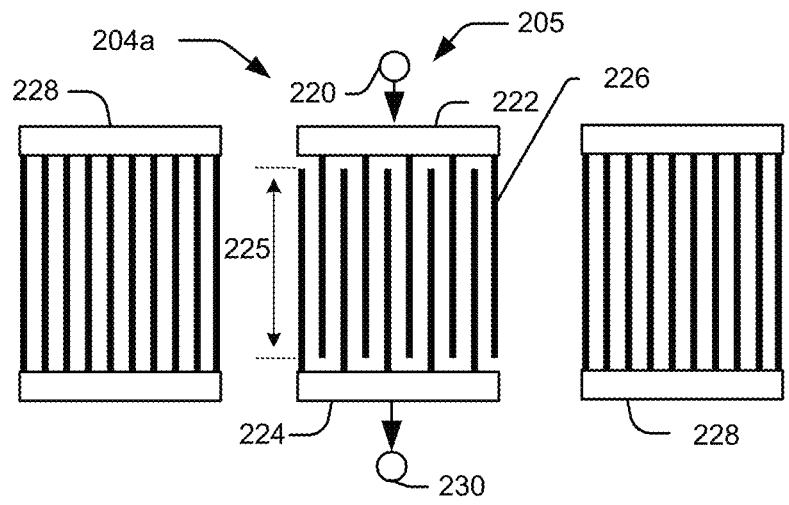
FIG. 2A is a diagram of a top view of an example of an electrode structure of an electroacoustic device.

FIG. 2A is a diagram of a top view of an example of an electrode structure 204a of an electroacoustic device 100. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222.

In the direction along the busbars, there is an overlap region including a central region where a portion of one finger overlaps with a portion of an adjacent finger as illustrated by the central region 225. The central region 225 including the overlap may be referred to as the aperture, track, or active region where electric fields are produced between fingers 226 to cause an acoustic wave to propagate in the central region 225 of the piezoelectric material 102. The periodicity of the fingers 226 is referred to as the pitch of the IDT. The pitch may be indicted in various ways. For example, in certain aspects, the pitch may correspond to a magnitude of a distance between fingers in the central region 225. The distance may be defined, for example, as the distance between center points of each of the fingers (and may be generally measured between a right (or left) edge of one finger and the right (or left) edge of an adjacent finger when the fingers have uniform thickness). In certain aspects, an average of distances between adjacent fingers may be used for the pitch. The frequency at which the piezoelectric material vibrates within a given stack (e.g., a full stack including a piezoelectric layer and electrode structure combination) is a self-resonance (also called a "main-resonance") frequency of the electrode structure 204a. The frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output such as one of the first terminal 220 or the second terminal 230 while the other terminal may function as an input.

A variety of electrode structures are possible. FIG. 2A may generally illustrate a one-port configuration. Other 2-port configurations are also possible. For example, the electrode structure 204a may have an input IDT 205 where each terminal 220 and 230 functions as an input. In such an event, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

Figure 2B:
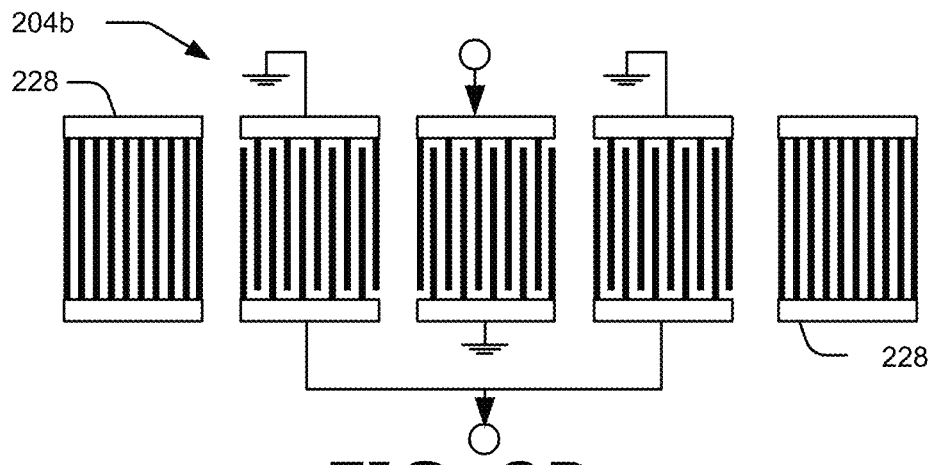
FIG. 2B is a diagram of a top view of another example of an electrode structure of an electroacoustic device.

FIG. 2B is a diagram of a top view of another example of an electrode structure 204b of an electroacoustic device 100. Such a dual-mode SAW (DMS) electrode structure 204b is illustrated that is a structure which may induce multiple resonances. The electrode structure 204b includes multiple IDTs along with reflectors 228 connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and lengths and width of the fingers 226 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

Figure 3A:
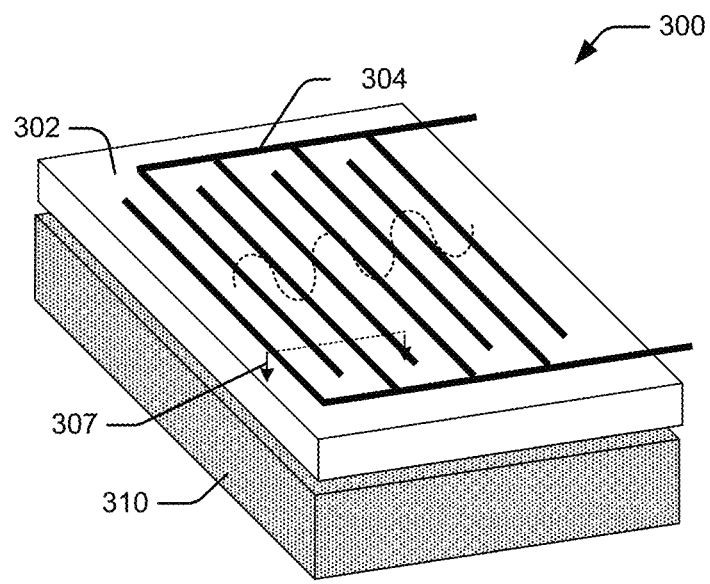
FIG. 3A is a diagram of a perspective view of another example of an electroacoustic device.

FIG. 3A is a diagram of a perspective view of another example of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator (TF-SAW) in some cases. Based on the type of piezoelectric material 302 used (e.g., typically having higher coupling factors relative to the electroacoustic device 100 of FIG. 1) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher Q-factor as compared to the electroacoustic device 100 of FIG. 1A. The piezoelectric material 302, for example, may be Lithium tantalate (LiTaO3) or some doped variant. Another example of a piezoelectric material 302 for FIG. 3A may be Lithium niobate (LiNbO3). In general, the substrate 310 may be substantially thicker than the piezoelectric material 302 (e.g., potentially on the order of 50 to 100 times thicker as one example—or more). The substrate 310 may include other layers (or other layers may be included between the substrate 310 and the piezoelectric material 302).

Figure 3B:
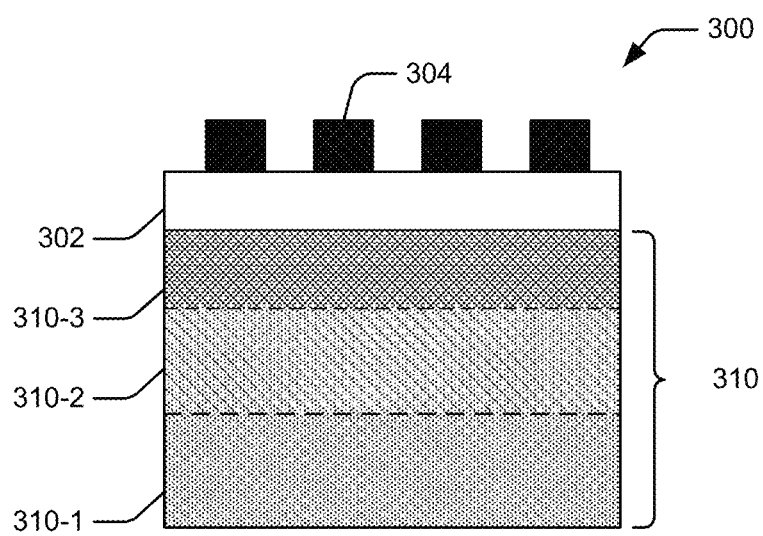
FIG. 3B is a diagram of a side view of the electroacoustic device of FIG. 3A.

FIG. 3B is a diagram of a side view of the electroacoustic device 300 of FIG. 3A showing an exemplary layer stack (along a cross-section 307). In the example shown in FIG. 3B, the substrate 310 may include sublayers such as a substrate sublayer 310-1 (e.g., of silicon) that may have a higher resistance (e.g., relative to the other layers—high resistivity layer). The substrate 310 may further include a trap rich layer 310-2 (e.g., poly-silicon). The substrate 310 may further include a compensation layer 310-3 (e.g., silicon dioxide (SiO2) or another dielectric material) that may provide temperature compensation and other properties. These sub-layers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices such as between the electroacoustic device 100 of FIG. 1A and the electroacoustic device 300 of FIGS. 3A and 3B.

Figure 4:
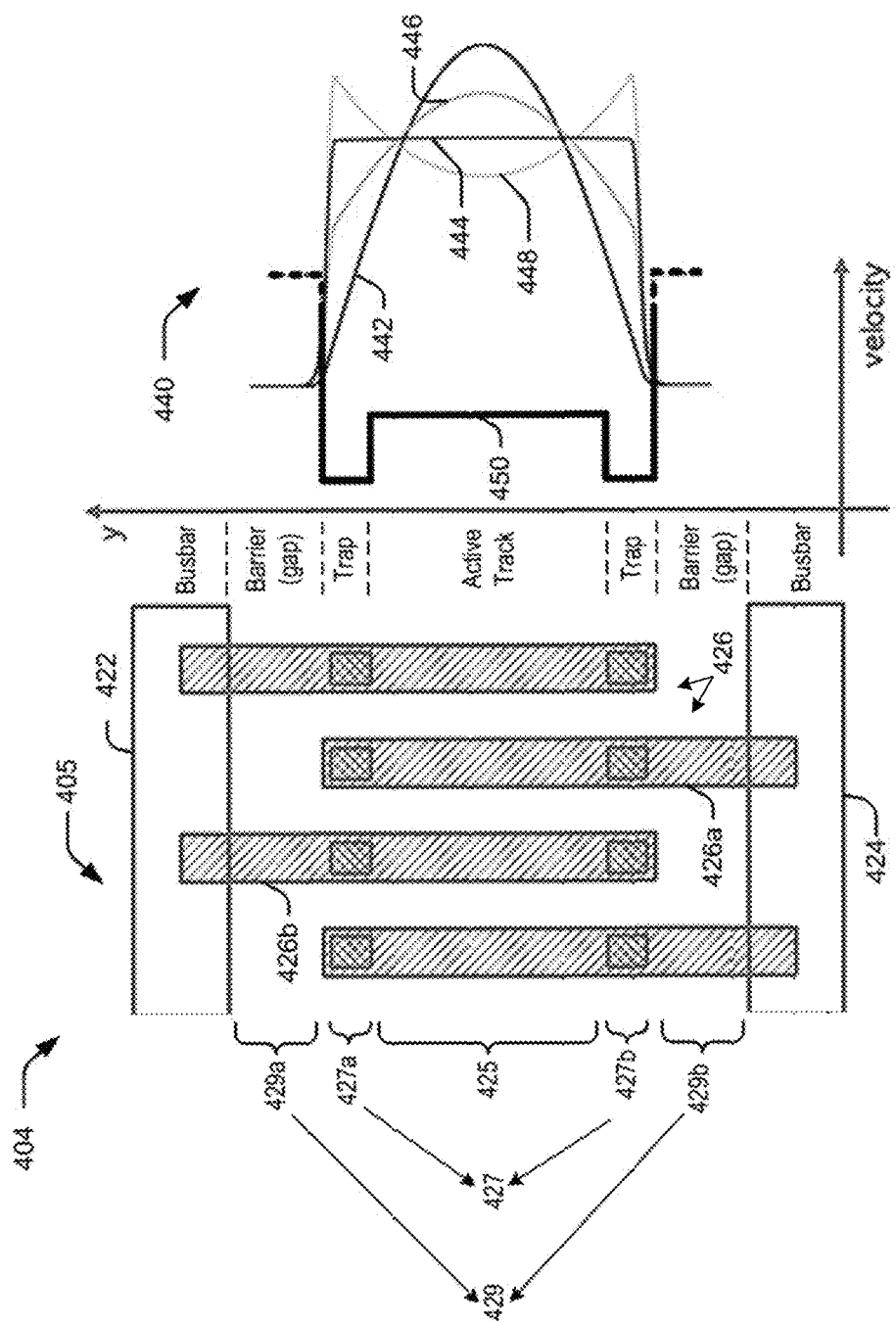
FIG. 4 is a diagram of a portion of an electrode structure of an electroacoustic device aligned with a plot illustrating acoustic velocity profiles in different regions of the electroacoustic device.

FIG. 4 is a diagram of a portion of an electrode structure 404 of an electroacoustic device aligned with a plot illustrating acoustic velocity profiles in different regions of the electroacoustic device. The electrode structure 404 of FIG. 4 shows a portion of an IDT 405 similar to that described with reference to FIG. 2A with a first busbar 422, a second busbar 424, and interdigitated fingers 426. As the angles and frequency position of the transversal acoustic wave modes depend on the directional acoustic wave velocity, in an aspect, the transversal velocity profile within the acoustic track can designed in such a way to reduce transversal acoustic wave modes and promote excitation of the main or fundamental mode. In particular, the electrode structure 404 (and potentially other layers) can be adjusted in different regions of the electrode structure 404 to adjust the transversal velocity profile within the acoustic track to reduce transversal acoustic modes. In certain aspects, an acoustic velocity may correspond to an acoustic velocity of the fundamental mode of the electroacoustic device, although the velocity may be understood more generally in certain respects to capture or relate to different modes.

The example of FIG. 4 illustrates different regions of the electrode structure 404 that may be designed or structurally altered to adjust the transversal velocity profile. As described with respect to FIG. 2A, a central region 425 (or active track region or aperture) is defined where interdigitated fingers overlap (e.g., in the direction parallel to the busbar) and is where the main or fundamental mode is generally intended and designed to propagate perpendicular to the fingers 426.

In an aspect, barrier regions 429 (e.g., gap regions) are defined outside the central region 425 that include regions between the first busbar 422 and fingers 426a connected to the opposite second busbar 424. More particularly, the barrier regions 429 include a first barrier region 429a and a second barrier region 429b. The first barrier region 429a is defined between the first busbar 422 and unconnected ends of a first set of fingers 426a connected to the second busbar 424. The second barrier region 429b is defined between the second busbar 424 and unconnected ends of a second set of fingers 426b connected to the first busbar 422. The barrier regions 429 may sometimes correspond to or be referred to as a transversal gap which is included in IDTs to separate metal structures of different potentials (i.e., separate fingers connected to opposite busbars where the busbars have different potentials).

To adjust the transversal velocity profile, the number of fingers per wavelength within the barrier regions 429 (e.g., one finger instead of the two fingers as illustrated in the central region 425) along with the distance or size of the barrier regions 429 are selected (and/or with adjustment of other characteristics within the barrier regions 429) so that there is a higher acoustic wave velocity, particularly higher than in the central region 425. The plot 440 to the right of the electrode structure 404 illustrates relative velocities of each region of the electrode structure 404 where the y-axis represents and is aligned with different regions of the electrode structure 404 along the direction the fingers 426 extend. As illustrated by line 450 (see dashed line portions), the acoustic velocity along the x-axis is higher in the barrier regions 429 as compared to the acoustic velocity in the central region 425 (e.g., active track). In general, as an acoustic wave may tend to propagate more easily where velocity is lower, a relative higher wave velocity may be a barrier for the acoustic wave. A distance/width of the barrier regions 429 (e.g., in some aspects, at least 2-3 micrometers (um) to sufficiently separate metal structures of different potentials, in other aspects, as little as 200 nanometers (nm) or as much as 8-10 um), provides a sufficient barrier and prevents acoustic waves from coupling to outside regions.

In addition to the barrier regions 429, further regions referred to as a trap regions 427 are provided at either outer boundary of the central region 425 (e.g., bound on each end) where the fingers 426 overlap. In particular, a first trap region 427a is positioned towards or at a first end (e.g., boundary) of the central region 425 (e.g., active region) and between the first barrier region 429a and the central region 425 (e.g., in a region of the fingers 426 that is towards an end of the first set of fingers 426a that are connected to the second busbar 424 where the region is distal from the second busbar 424). A second trap region 427b is positioned towards or at a second end of the central region 425 (opposite the first end) and between the second barrier region 429b and the central region 425 (e.g., in a region of the fingers that is towards an end of the second set of fingers 426b that are connected to the first busbar 422 where the region is distal from the first busbar 422). The trap regions 427 may correspond to outer edges or outer regions of the central region 425. A structural characteristic in the trap regions 427 different than in the central region 425 is provided to create a region of the electroacoustic device aligned with the trap regions 427 that has a reduced acoustic wave velocity, in particular to be lower than an acoustic wave velocity in the central region 425. Such structural characteristics may include widening the electrode fingers 426 in the trap regions 427 or increasing the height of the electrode fingers 426 in the trap regions 427, but many implementations are possible. In general, an acoustic wave may tend to propagate more easily where velocity is lower. The trap regions 427 with a lower acoustic wave velocity may thereby provide a way to shape the transversal amplitude profile of the fundamental acoustic wave mode.

As a result of designing and selecting sizes for the barrier regions 429, the trap regions 427, and the central region 425, the fundamental acoustic wave mode amplitude in the transversal directions (e.g., in the direction of the fingers 426) may be conformed towards a rectangular profile as indicated by line 444 of the plot 440. The rectangular profile caused by the different acoustic wave velocities in the different regions corresponds to a mode where undesired transversal modes are suppressed. Line 442 in the plot 440 corresponds to the fundamental mode amplitude in the transversal direction without trap regions which may lead to undesired transversal modes. Line 446 in the plot 440 corresponds to the fundamental mode amplitude in the transversal direction where the trap regions 427 are insufficiently deep (e.g., acoustic wave is not sufficiently slowed within that region). Although improved, undesired transversal modes may continue to impact performance. Line 448 in the plot 440 corresponds to the fundamental mode amplitude in the transversal direction where the trap regions 427 are too deep. This may also result in undesired transversal acoustic wave modes. By adjusting the characteristics of the barrier regions 429 and the trap regions 427, the fundamental mode amplitude in the transversal direction can be adjusted to conform towards the rectangular profile indicated by line 444 and transversal modes are effectively suppressed. The techniques for providing the barrier regions 429 and the trap regions 427 in such configurations are sometimes referred to a piston mode.

Figure 5A:
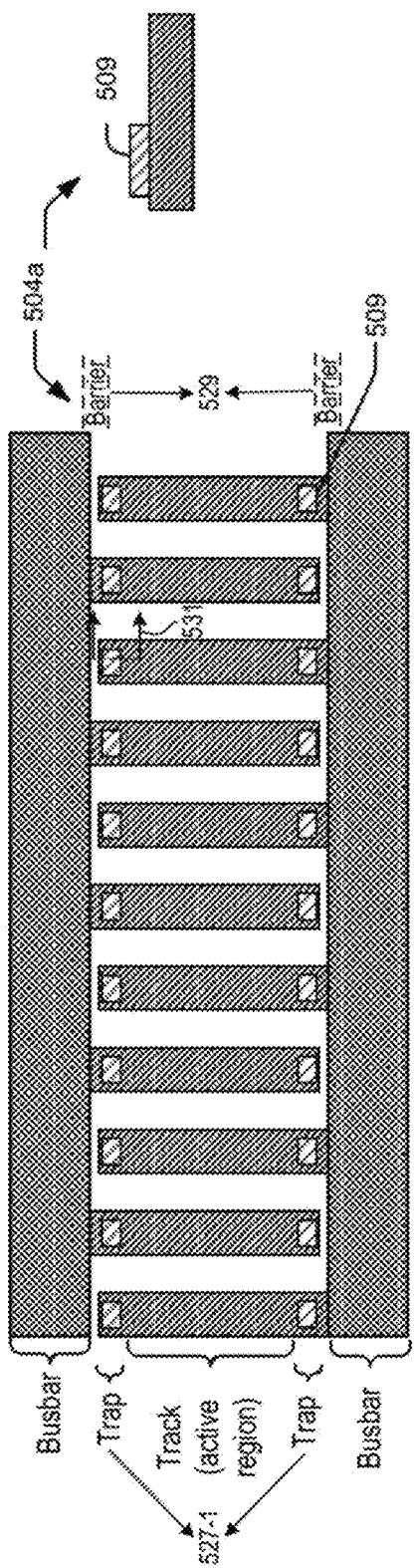
FIGS. 5A and 5B are diagrams of examples of electrode structures that illustrate examples of different implementations of trap regions as defined with reference to FIG. 4.
Figure 5B:
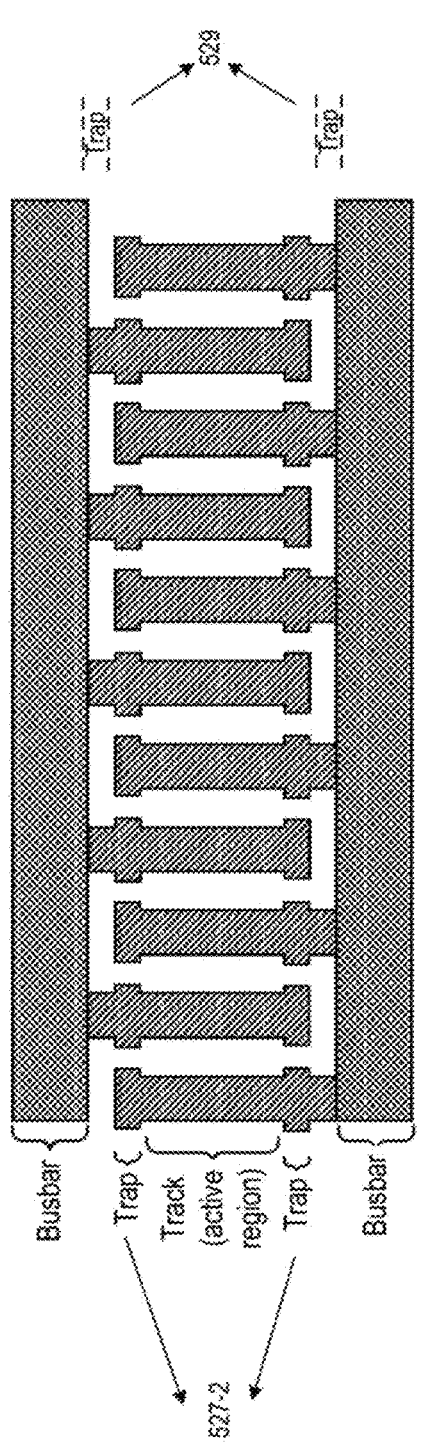

FIGS. 5A and 5B are diagrams of examples of electrode structures 504a and 504b that illustrate examples of different implementations of trap regions 527-1 and 527-2 as defined with reference to FIG. 4. Barrier regions 529 are denoted but are not particularly illustrated or drawn to scale. Rather, the electrode structures 504a and 504b are provided to illustrate implementations of the trap regions 527-1 (FIG. 5A) and 527-2 (FIG. 5B). For example, in the electrode structure 504a of FIG. 5A, the trap regions 527-1 are illustrated with a portion 509 of the electrode structure 504a having an increased thickness relative to other portions of the active region. A side view is shown on right along a cross-section 531. The increased height may result in a slower acoustic velocity in the trap regions 527-1. In another implementation, as illustrated by the electrode structure 504b of FIG. 5B, the electrode structure 504b within the trap regions 527-2 has a width that is wider as compared to the active region. These wider widths may result in a slower acoustic velocity in the trap regions 527-2. In some implementations, the trap regions 527-2 may have both a width that is wider as compared to the active region along with an increased height (e.g., thickness) as illustrated in FIG. 5A. As such, any techniques described herein for the trap regions 527-2 may be combined. In other implementations, other materials (e.g., a layer of dielectric material) may be positioned over the trap regions 427 (FIG. 4) to reduce an acoustic velocity in the trap regions 427 (e.g., or other types of mass loading). In addition, one or more trimming operations may adjust or have a structural effect in the various regions so that the relative acoustic velocity in the trap regions 427 are reduced relative to the central region 425. Other implementations using different techniques may also be employed such that structural characteristics in the trap regions 427 are adjusted and different than in the central region 425 so that there is reduced acoustic velocity in trap regions 427.

In certain electroacoustic device designs, the barrier regions 429 may be a sufficient parameter that can be adjusted to create the desired transversal acoustic velocity profile to work in conjunction with the trap regions 427 to suppress transversal acoustic modes (e.g., achieve relatively higher acoustic velocity than in the active region). However, for certain other electroacoustic devices desired using different materials, configuring the size of the barrier regions 429 may not create a transversal mode acoustic profile that causes the acoustic velocity in the barrier regions 429 to be sufficiently high to create the desired transversal velocity profile. For example, FIGS. 3A and 3B illustrate a thin-film type of electroacoustic device 300. In some implementations, the piezoelectric material 302 in this electroacoustic device 300 may be formed from Lithium tantalate (LiTaO3). The acoustic velocity profile for Lithium tantalate may be different than other systems based on the coupling factor (and may be due in part to the particular layer stack and thickness of Lithium tantalate such as for the thin-film type shown in FIGS. 3A and 3B). For example, for a Lithium tantalate based device, the difference in velocity between the central region 425 and the barrier regions 429 may be lower and therefore transversal modes may not be as easily confined over the entire stopband width of the electroacoustic device 300. In addition, in some systems, in the central region 425, increased frequency may correspond to increasing angles from the main acoustic wave propagation direction (e.g., sometimes referred to as a "convex slowness"). In some systems (e.g., in some Lithium tantalate based systems), in the barrier regions 429, mode frequency decreases with increasing propagation angles (a "concave slowness" in barrier regions 429). A concave slowness may be attractive for the acoustic wave and spurious modes may be formed. Having a concave slowness in the barrier regions 429 may therefore result in undesired modes to be excited within the barrier regions 429.

Certain techniques to address these issues for electroacoustic devices may be difficult to implement for higher metallization ratios and higher metal heights (and due to other manufacturing difficulties of such solution) and may increase ohmic losses. In some implementations, metallization rations can be between 0.45 to 0.7. Aspects described herein can be implemented with such metallization rations. Lower metallization rations, which can be metallization rations below 0.55 as described herein, may be implemented with fewer of the difficulties described above in some implementations. For example, in some aspects, weighted sections formed of increased widths or dots on sections electrode fingers can be more difficult to manufacture with high frequency components and/or a high metallization ration. In addition, barrier regions 429 as described with reference to FIG. 4 (e.g., including 1 stripper wavelength) may lead to concave slowness for certain configurations such as when using Lithium tantalate based devices as described above with reference to FIG. 3A.

Figure 6:
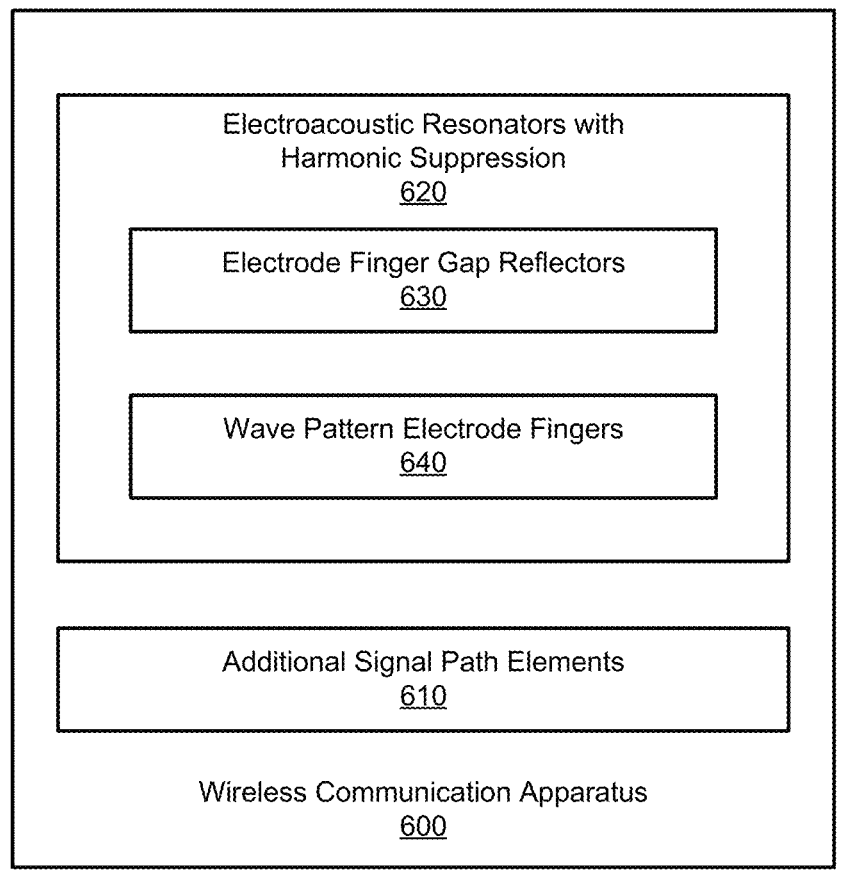
FIG. 6 is a representation of a wireless communication apparatus including an electroacoustic resonator, in accordance with examples described herein.

FIG. 6 is a representation of a wireless communication apparatus 600 including an electroacoustic resonator 620, in accordance with examples described herein. The wireless communication apparatus 600 can use various filter elements, including one or more electroacoustic resonators 620, to achieve signal characteristics that meet targets for a given communication system. As described above, transmission and receive paths of a such a wireless communication apparatus can include a plurality of signal (e.g., transmission and receive) path elements, illustrated as including the electroacoustic resonator(s) 620 having harmonic suppression structures, as well as additional signal path elements 610. The additional signal path elements 610 can include low noise amplifiers (LNAs), mixers, transmission lines, filter elements including various different SAW resonators, BAW resonators, and other elements. Under high power loads, a SAW can emit harmonic signals that can follow parasitic paths through the wireless communication apparatus 600 that can interfere with signals in the additional signal path elements 610. Such high power loads can particularly occur in a transmission path after amplification of a signal, at conditioning filters between an amplifier and a transmission antenna.

The electroacoustic resonator 620 includes both electrode finger gap reflectors 630, as well as wave pattern electrode fingers. As discussed above and further below, electroacoustic resonators include electrode fingers. The electrode finger gap reflectors 630 include metallization lines perpendicular to the electrode fingers. The wave pattern electrode fingers 640 refers to a pattern formed by an end of certain electrode fingers, as well as weighted sections of electrode fingers that can be included in the same pattern as described in detail below. Such structures can be formed around the barrier regions 429 described above to suppress transversal modes that can contribute to harmonic signals that can propagate through a device. The combination of both the electrode finger gap reflectors 630 and the wave pattern electrode fingers 640 can result in significantly improved harmonic suppression when compared with each suppression structure without the other. Details of such improvements in performance in a device including both the electrode finger gap reflectors 630 and the wave pattern electrode fingers compared with a device including only the electrode finger gap reflectors 630 is illustrated below in FIG. 10. The described structures and techniques may apply to a variety of different types of electroacoustic devices (e.g., BAW devices), but include specific advantages for thin-film SAW electroacoustic devices, and thin-film electroacoustic devices using Lithium tantalate.

Figure 7A:
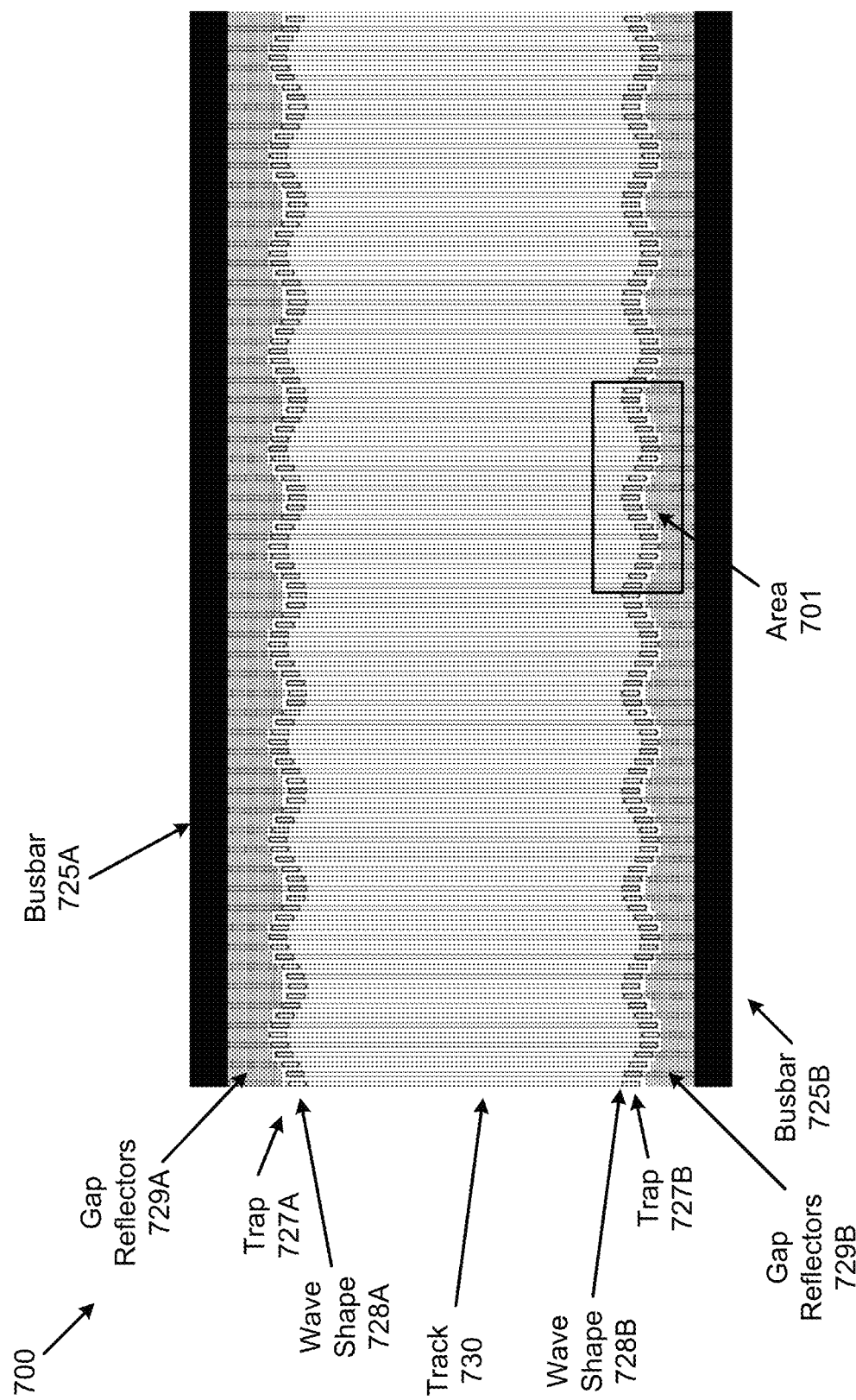
FIG. 7A is a representation of an electroacoustic resonator illustrating aspects of harmonic suppression structures, in accordance with aspects described herein.

FIG. 7A is a representation of an electroacoustic resonator 700 illustrating aspects of harmonic suppression structures, in accordance with aspects described herein. Similar to the resonators described above, the electroacoustic resonator 700 includes busbars 725A and 725B, traps 727A and 727B, and a track 730. The track 730 functions to filter signals using electroacoustic resonance as described above. As described above, transversal waves within the electroacoustic resonator 700 can propagate both through a signal path that includes the electroacoustic resonator 700, as well as via parasitic paths to other signal paths (e.g., from a transmission path to a receive path, between transmission paths in a device with multiple channel operation, etc.). To suppress such harmonic signals, the electroacoustic resonator 700 includes suppression structures in the form of both the wave shapes 728B and 728B and the gap reflectors 729A and 729B. The wave shapes 728A and 728B can bound the traps 727A and 727B between ends of electrode fingers extending from the opposite busbar (e.g., the trap 727A between the ends of electrode fingers extending from the busbar 725B and the busbar 725A). The gap reflectors can similarly operate to dampen harmonic signals within such trap areas (e.g., the gap reflectors 729A in the trap 727A area).

In some implementations, sine or cosine wave shapes can be used. In other implementations, triangle waves or other functional smooth shapes that can be repeated every 10 to 50 electrode fingers can be used. In some implementations, the wave shapes out of phase (e.g., offset from each other along the track) to provide a change in aperture (e.g., overlapping finger length).

Figure 7B:
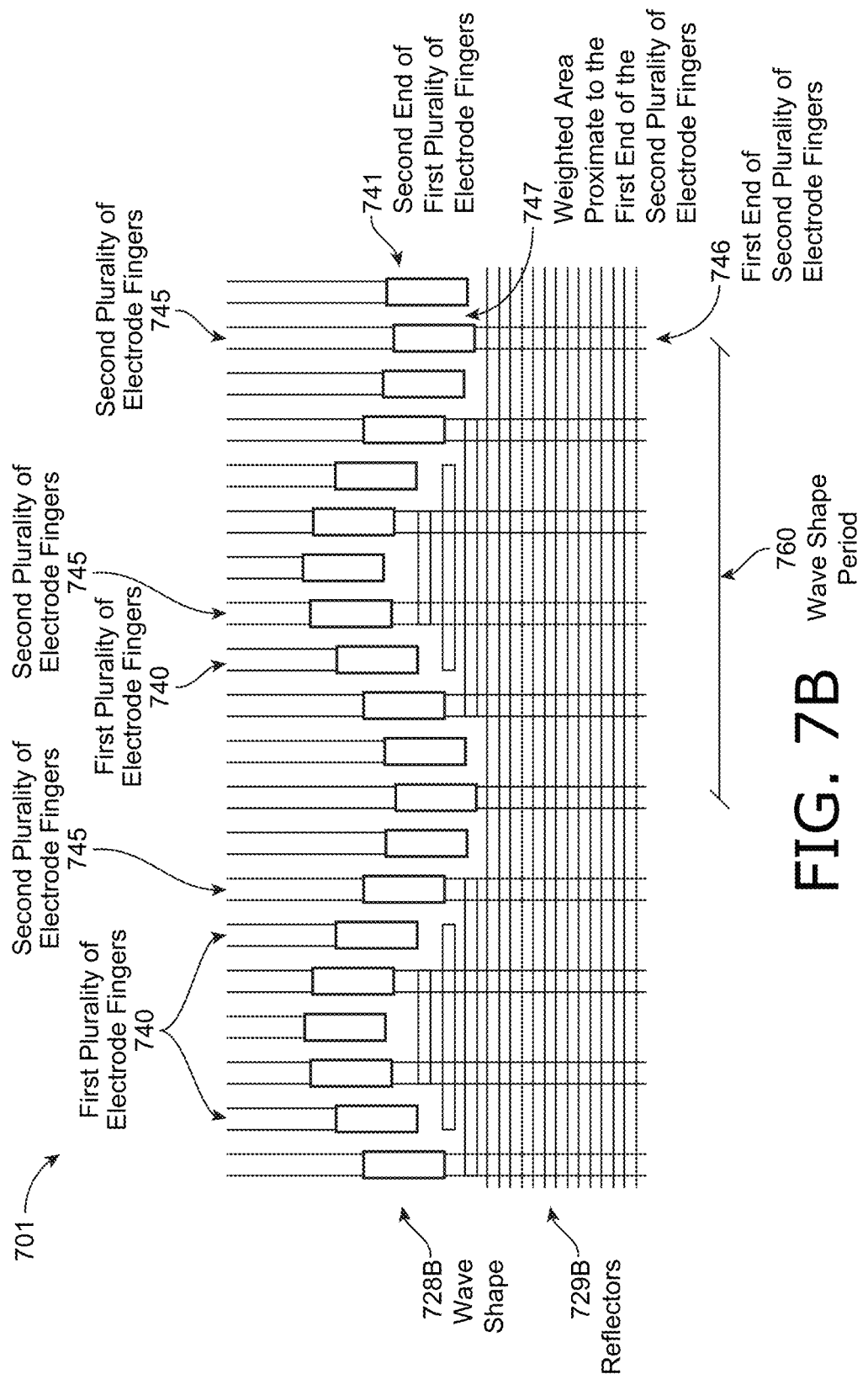
FIG. 7B is a representation of an electroacoustic resonator illustrating aspects of harmonic suppression structures, in accordance with aspects described herein.

FIG. 7B is a representation of an area 701 of the electroacoustic resonator 700 illustrating aspects of harmonic suppression structures, in accordance with aspects described herein. The area 701 of FIG. 7B is an enlarged illustration of the area 701 of FIG. 7A. The area 701 includes the lower wave shape 728B near the busbar 725B (not shown in FIG. 7B). The area 701 shows portions of the electroacoustic resonator 700 including a first plurality of electrode fingers 740 coupled to the first busbar 725A (not shown in FIG. 7B). The first plurality of electrode fingers 740 extend from the first busbar 725A in a perpendicular direction towards the second busbar 725B without touching the second busbar 725B. Each of the first plurality of electrode fingers having a first end coupled to the first busbar 725A and a second end 741 proximate to the second busbar 725B. Such proximate positioning, as used herein, can refer to positioning with ends extending towards a busbar, ends within a relatively close positioning when compared with dimensions of a resonator, or ends positioned closer to a busbar than to a first end of a finger. Each of the first plurality of electrode fingers 740 extends a different distance toward the second busbar 725B from adjacent electrode fingers of the first plurality of electrode fingers such that the second end of each of first plurality of electrode fingers collectively form the wave shape 728B. As can be seen, a leftmost finger of fingers 740 extends a different distance away from the busbar 725A (e.g., which is approximately perpendicular to the electrode fingers 740) from the two electrode fingers 740 to the right of the leftmost finger of fingers 740. The central electrode finger of these three leftmost electrode fingers 740 has a different length (e.g., ending distance from the originating busbar) from the two adjacent electrode fingers on either side of the central finger. The directly adjacent electrode fingers are interleaved fingers from the other set of electrode fingers which are attached to the other busbar 725B. The area opposite the area 701 of the electroacoustic resonator 700 will include corresponding features on the opposite side of the track 730.

The area 701 includes a second plurality of electrode fingers 745 coupled to the second busbar 725B and extending in the perpendicular direction toward the first busbar 725A without touching the first busbar 725A. Each of the second plurality of electrode fingers 745 has a first end 746 coupled to the second busbar 725B and a second end proximate to the first busbar 725A (not shown in FIG. 7B, similar to the second end 741 of the first plurality of electrode fingers shown in the area 701, but on the opposite side of the electroacoustic resonator 700 across the track 730). Just as described above for the first plurality of electrode fingers 740, each of the second plurality of electrode fingers 745 extends a different distance toward the first busbar 725A from adjacent electrode fingers of the second plurality of electrode fingers 745, such that the second end of each of second plurality of electrode fingers collectively form the wave shape 728B. The first plurality of electrode fingers 740 and the second plurality of electrode fingers 745 are interleaved such that each electrode finger other than a first and second ending finger (e.g., at opposite ends of the track 730) is adjacent to two other electrode fingers connected to an opposite busbar. For example, as illustrated, each finger of the first plurality of electrode fingers 740 is adjacent to two of the second plurality of electrode fingers 745. Similarly, each of the second plurality of electrode fingers 745 is adjacent to two of the first plurality of electrode fingers 740.

The electroacoustic resonator 700 includes the first plurality of gap reflectors 729A. The gap reflectors are substantially parallel to the first busbar 725A (FIG. 7A) and perpendicular to the electrode fingers that fill the track 730, with the gap reflectors 729A and 729B configured dampen signals outside of the track 730 as described above. The first plurality of gap reflectors 729A, as described above, are positioned between the first busbar 725A and a curve associated with the second wave shape 728A. The area 701 includes the second plurality of gap reflectors 729B which are also parallel to the second busbar 725B and perpendicular to the electrode fingers in the track 730. As mentioned above, the second plurality of gap reflectors 729B are positioned between the second busbar 725B and a curve associated with the first wave shape 728B.

In some aspects, the electroacoustic resonator 700 can have the wave shapes 728A and 728B that are periodic. In some implementations, the periodic curve associated with the wave shapes 728A and 728B are sine or cosine curves. In other aspects, other shapes are used. In various aspects a phase offset (e.g., shift in the curves along the track 730 direction) is used to provide an aperture or difference in electrode finger overlap. The illustrated area 701 of the electroacoustic resonator 700 includes curves with a wave shape period 760 that repeats across the track 730. The illustrated wave shape period 760 includes 10 electrode fingers (e.g., 5 from the first plurality of electrode fingers 740 and 5 from the second plurality of electrode fingers 745). In other aspects, an electroacoustic resonator in accordance with aspects described herein can use different numbers of finger electrodes to define a curve associated with wave shapes, such as 8 electrode fingers, 20 electrode fingers, 30 electrode fingers, or any other such numbers of electrode fingers depending on a particular device operation).

In some aspects, the curve of the wave shape (e.g., the wave shape 728B) can be defined by the second ends 741 of the first plurality of electrode fingers 740, without the second plurality of electrode fingers 745 (e.g., which are coupled to the proximate busbar 725B) including any structure contributing to the curve associated with the wave shape. In the electroacoustic resonator 700, the electrode fingers each include two weighted sections, one at an end proximate to the busbar that the electrode finger is coupled to (e.g., with the weighted area spaced across a trap region from the busbar) and one at the end of the electrode finger where the electrode finger stops prior to touching the opposite busbar. As shown in FIG. 7B, the second plurality of electrode fingers 745 include weighted sections 747 proximate to the first end of the second plurality of electrode fingers. The weighted sections 747 can additionally define or contribute to the curve associated with the wave shape 728A and/or wave shape 728B. In the area 701 illustrated by FIG. 7B, the weighted sections at the second end 741 of the first plurality of electrode fingers 740 and the weighted sections 747 close to the first end of each of the second plurality of electrode fingers 745 both contribute to the wave shape 728B.

At the opposite side of the electroacoustic resonator 700, the wave shape 728A is defined by similar weighted structures in areas of the first plurality of electrode fingers 740 and the second plurality of electrode fingers 745 close to the first busbar 725A. The weighted sections can additionally contribute to the resonance suppression structures by contributing to maintaining signals within the track 730 and out of the trap regions where transvers signals and harmonics can be significant. Such weighted areas can, for example, be created by adding an additional thickness to the metallization layer used to create the electrode fingers, as illustrated in FIG. 5A. In other implementations, additional width can be added to these areas of the electrode fingers, as illustrated in FIG. 5B. Other examples of such weighted areas are described above with respect to FIGS. 5A and 5B (e.g., mass loading via a dielectric layer, trimming, and the like).

In the electroacoustic resonator 700, as illustrated by the area 701, the gap reflectors 729B (e.g., and the corresponding gap reflectors 729A at the opposite side of the track 730) are metallization lines transfers to the electrode fingers. In the area 701, the gap reflectors 729B are shown as metallization lines in a same metallization layer as the electrode fingers 740 and 745. The gap reflectors 729B are transfers across the second plurality of electrode fingers 745, and electrically connect the electrode fingers 745 at positions where the gap reflectors 729B touch the second plurality of electrode fingers 745. The gap reflectors 729B do not intersect with any of the first plurality of electrode fingers 740, as the first plurality of electrode fingers stop prior to the position of the gap reflectors 729B. Similarly, the second plurality of electrode fingers do not extend to the reflectors 729A. In the example of the electroacoustic resonator 700, the reflectors extend across at least two electrode fingers of the plurality of electrode fingers and can stop either at an electrode finger of the second plurality of electrode fingers 745, or at an intermediate position between electrode fingers of the second plurality of electrode fingers, where an electrode finger of the first plurality of electrode fingers 740 would extend if it reached past the wave shape 728B. The gap reflectors 729B include certain reflectors which extend for the entire length of the wave shape 728A or the wave shape 728B, but also includes certain gap reflectors which are short, due to the wave shape 728B having a varying distance from the proximate busbar (e.g., the wave shape 728B being proximate to the busbar 725B). Within portions of the wave shape 728B that are further away from the proximate busbar 725B, some reflectors 729B extend only a short ways before they are blocked by areas where the reflectors 729B would intersect the first plurality of electrode fingers 740, and such short gap reflectors 729B provide signal guidance along the track 730 without interfering with operation by coupling directly to finger electrodes extending from the opposite side of the track 730.

In any implementation, such gap reflectors can be positioned in or around a trap area such as the trap areas 727A and 727B. In some such implementations, the electroacoustic resonator 700 can include the first plurality of gap reflectors 729A perpendicular to the electrode fingers in the track 730, and parallel to the first busbar 725A, where the first plurality of gap reflectors are positioned between the first busbar 725A and a curve associated with the second wave shape 728A. Similarly, the electroacoustic resonator 700 can include a second plurality of gap reflectors 729B perpendicular to the electrode fingers in the track 730, and parallel to the second busbar 725B, with the second plurality of gap reflectors 729B positioned between the second busbar 725B and a curve associated with the first wave shape 728B.

In some aspects, gap reflectors have a minimum length, which can be defined by metallization layer processes, by electrode finger distances, or by other such criteria. In some aspects, reflectors are designed to extend at least one electrode finger period (e.g., a distance between adjacent electrode fingers. In some implementations, stub or floating gap reflectors can be less than such a distance or can be a floating reflector having a length equal to the metallization line geometry for the electrode fingers, or portions of an electrode finger length (e.g., or width).

Figure 7C:
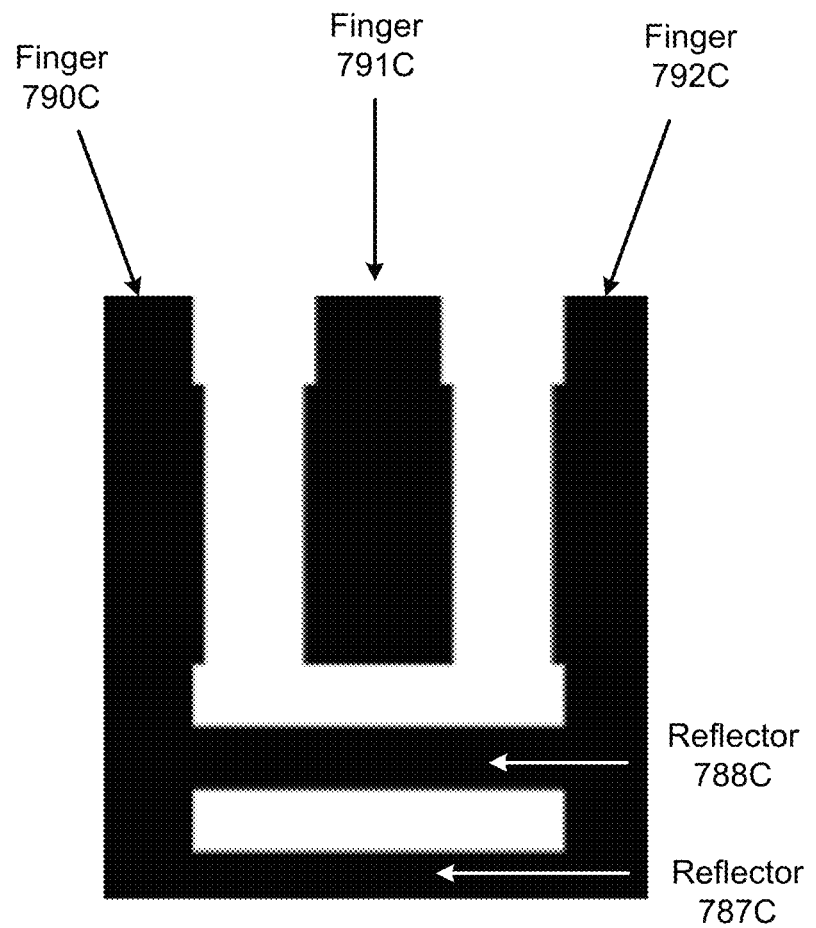
FIG. 7C is a representation of an electroacoustic resonator illustrating aspects of harmonic suppression gap reflectors, in accordance with aspects described herein.

FIG. 7C is a representation of an electroacoustic resonator illustrating aspects of harmonic suppression gap reflectors, in accordance with aspects described herein. FIG. 7C illustrates an enlarged image which can be similar to a portion of the electroacoustic resonator 700 of FIGS. 7A and 7B. FIG. 7C includes a central finger 791C (e.g., an electrode finger of the first plurality of electrode fingers 740), and electrode fingers 790C and 792C (e.g., adjacent electrode fingers of the second plurality of electrode fingers 745.)

The reflectors 788C and 787C extend across the gap between the electrode fingers 790C and 792C to couple the electrode fingers 790C and 792C, without touching the electrode finger 791C (e.g., which extends from a connection to the busbar 725A across the track 730 from the area where the fingers 790C and 792C couple with the reflectors 788C and 787C.)

Figure 7D:
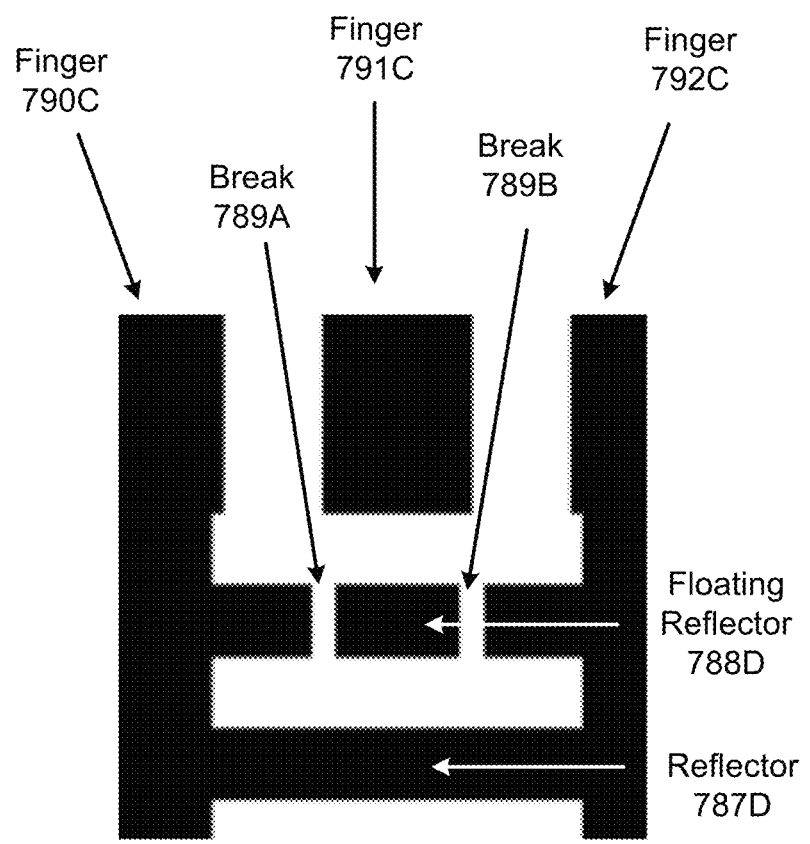
FIG. 7D is a representation of an electroacoustic resonator illustrating aspects of harmonic suppression gap reflectors, in accordance with aspects described herein.
Figure 7E:
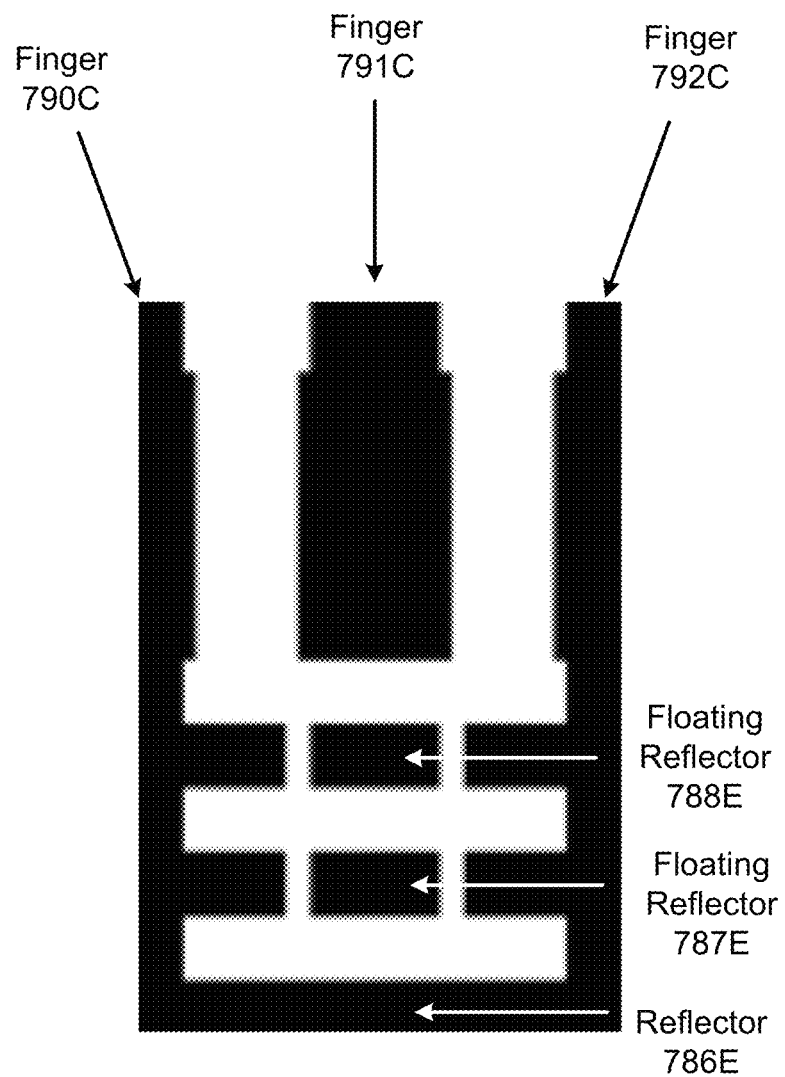
FIG. 7E is a representation of an electroacoustic resonator illustrating aspects of harmonic suppression gap reflectors, in accordance with aspects described herein.
Figure 8:
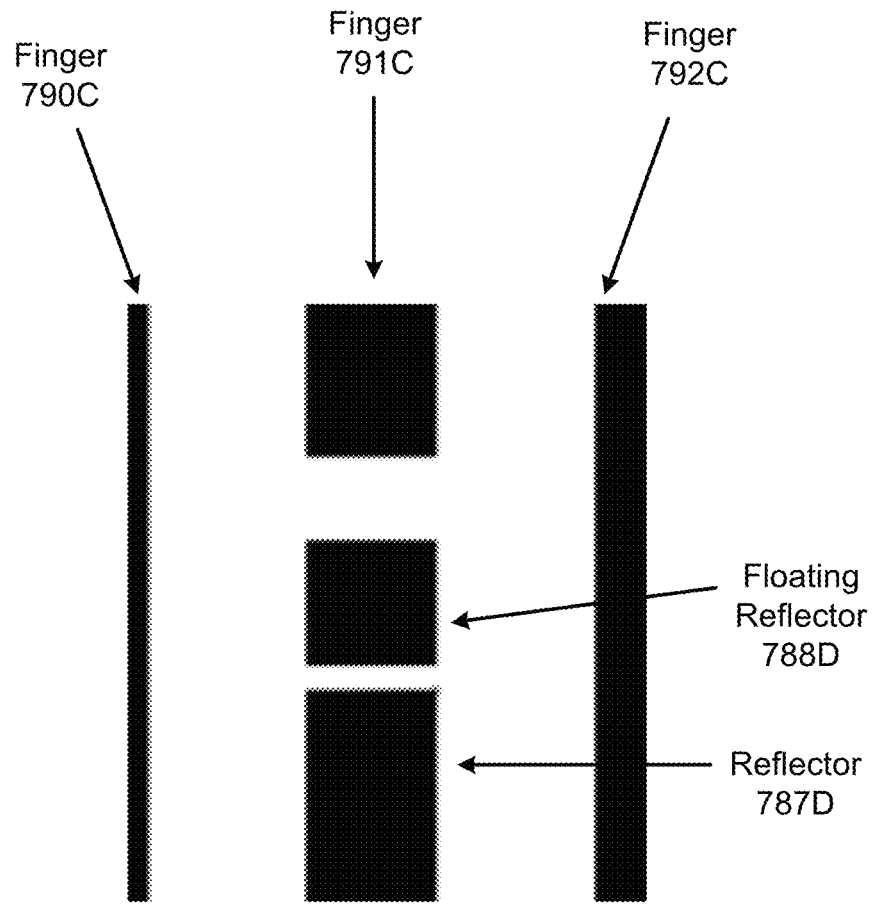
FIG. 8 is a representation of an electroacoustic resonator illustrating aspects of harmonic suppression gap reflectors, in accordance with aspects described herein.

FIGS. 7D-8 are representations of alternative gap reflectors within an electroacoustic resonator such as the electroacoustic resonator 700, in accordance with aspects described herein. Similar to the structure of FIG. 7C, the structure of FIG. 7D includes the same electrode fingers 790C, 791C, and 792C. The structure of FIG. 7D, however, includes breaks 789A and 789B (e.g., gaps) in the floating reflector 788D, such that the floating reflector 788D includes an area where the floating reflector 788D is not coupled to any electrode finger. The structure does include a non-floating reflector 787D and can include additional reflectors between the reflector 787D and the busbar coupled to the fingers 790C and 792C. Such floating parts within a gap reflector such as the gap reflector 788D can reduce the size of the electric field and the local capacitance in the illustrated area in a transversal direction. As second order nonlinear effects associated with second order harmonics that can degrade device performance as described above, such floating reflectors can reduce such second order harmonics beyond the use of an unbroken reflector (e.g., illustrated in FIGS. 7A-7C.) In various resonators and resonator applications, different configurations of floating gap reflectors such as the floating gap reflector 788D can be used based on various fabrication and application considerations to limit harmonic signals that degrade device performance. Such floating structures slightly change design performance such as an electrical trap length (e.g., associated with the traps 727A and 727B) to reduce energy in transversal modes of an electroacoustic resonator.

FIGS. 7E, and 8 each illustrate different gap reflector structures that can be used in different implementations of an electroacoustic resonator in accordance with aspects described herein. FIGS. 7D, 7E, and 8 all include the same electrode fingers 790C, 791C, and 792C from the FIG. 7C. FIG. 7E includes two stacked floating gap reflectors 788E and 787E in addition to a non-floating gap reflector 786E. In other implementations, any number of such floating gap reflectors can be used at any distance from a wave shape as described herein. FIG. 8 illustrates a reflector shape different than the shape, width, or length of the gap reflector lines of FIGS. 7C-E. In FIG. 8, floating reflectors 788D and 787D have geometries on an extension of the electrode finger 791C, instead of reflector lines perpendicular to the electrode fingers with an etched or gap section illustrated by the breaks 789A and 789B. The reflectors 788D and 787D can be fabricated as metallization elements along a line with a shared width the same as the electrode finger 791C.

Figure 9:
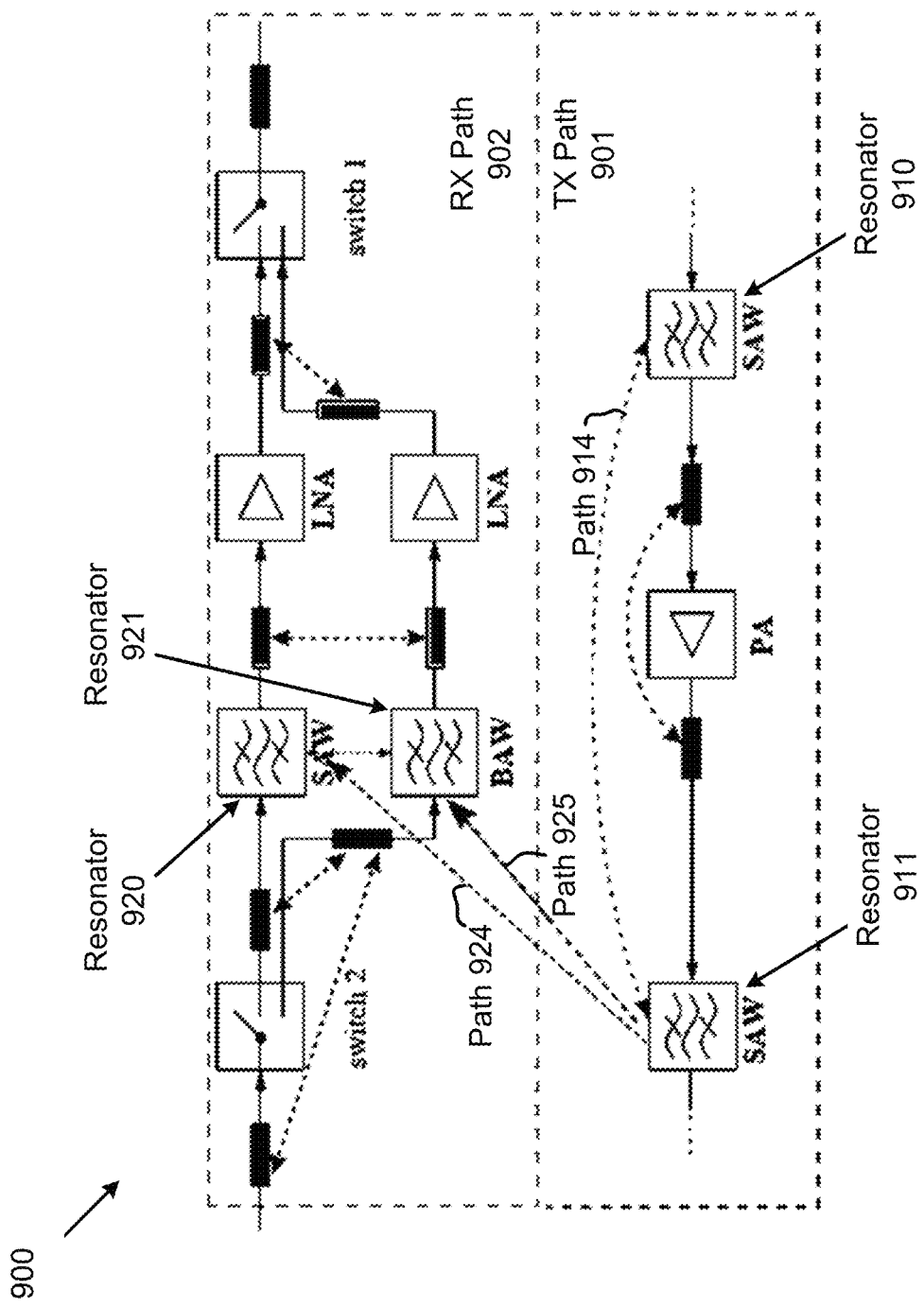
FIG. 9 is a representation of a wireless communication apparatus including an electroacoustic resonator for harmonic suppression, in accordance with aspects described herein.

FIG. 9 is a representation of a wireless communication apparatus 900 including electroacoustic resonators for harmonic suppression, in accordance with aspects described herein. The wireless communication apparatus 900 includes a transmission path 901 and a receive path 902. As described above, harmonics from an electroacoustic resonator can be particularly disruptive to device performance near a transmission path 901 output following power amplification of a signal, where the power through an electroacoustic resonator such as resonator 911 can be relatively high. In operation with high power through the resonator 911, harmonics from the resonator 911 can travel via parasitic paths 914, 925 and 924 to other electroacoustic resonators in a different path, such as resonator 910, as well as resonator 920 and resonator 921 in the receive path 902. The interference from the harmonics in such paths can interfere with electroacoustic signals not only in SAW resonators, but also other resonators such as BAW resonators. Suppression of transverse modes in a device as described above, using a wave pattern in the electrode fingers and gap reflectors, can suppress noise from such sources within a design.

Figure 10:
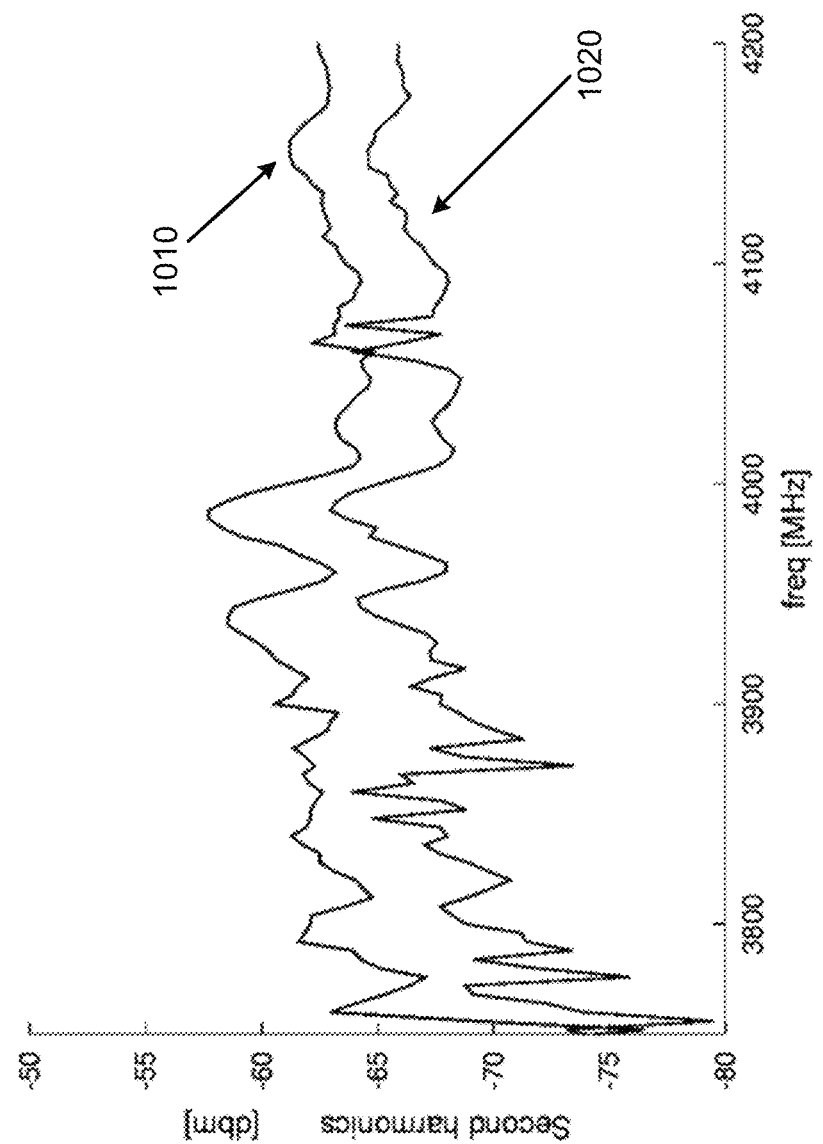
FIG. 10 is a chart illustrating improvements in device performance of a wireless communication with an electroacoustic resonator including harmonic suppression, in accordance with aspects described herein.

FIG. 10 is a chart 1000 illustrating improvements in device performance of a wireless communication with an electroacoustic resonator including harmonic suppression, in accordance with aspects described herein. The chart 1000 illustrates an example of frequency on the horizontal axis charted against second harmonic power in the vertical axis.

The line 1010 shows a curve for an electroacoustic resonator without both wave shape structures and gap reflectors. The line 1020 shows a curve for an electroacoustic resonator with both the wave shape structure and the gap reflectors described above. The line 1010 shows additional power in the second harmonics across the illustrated frequency spectrum without the inclusion of both the wave shape structures and gap reflectors. Such additional power in second harmonics can contribute to parasitic noise and performance degradation as described above. By contrast, the line 1020 shows significant suppression of the second harmonic power when both the gap reflectors and the wave shape structures described above are included in a resonator.

Figure 11:
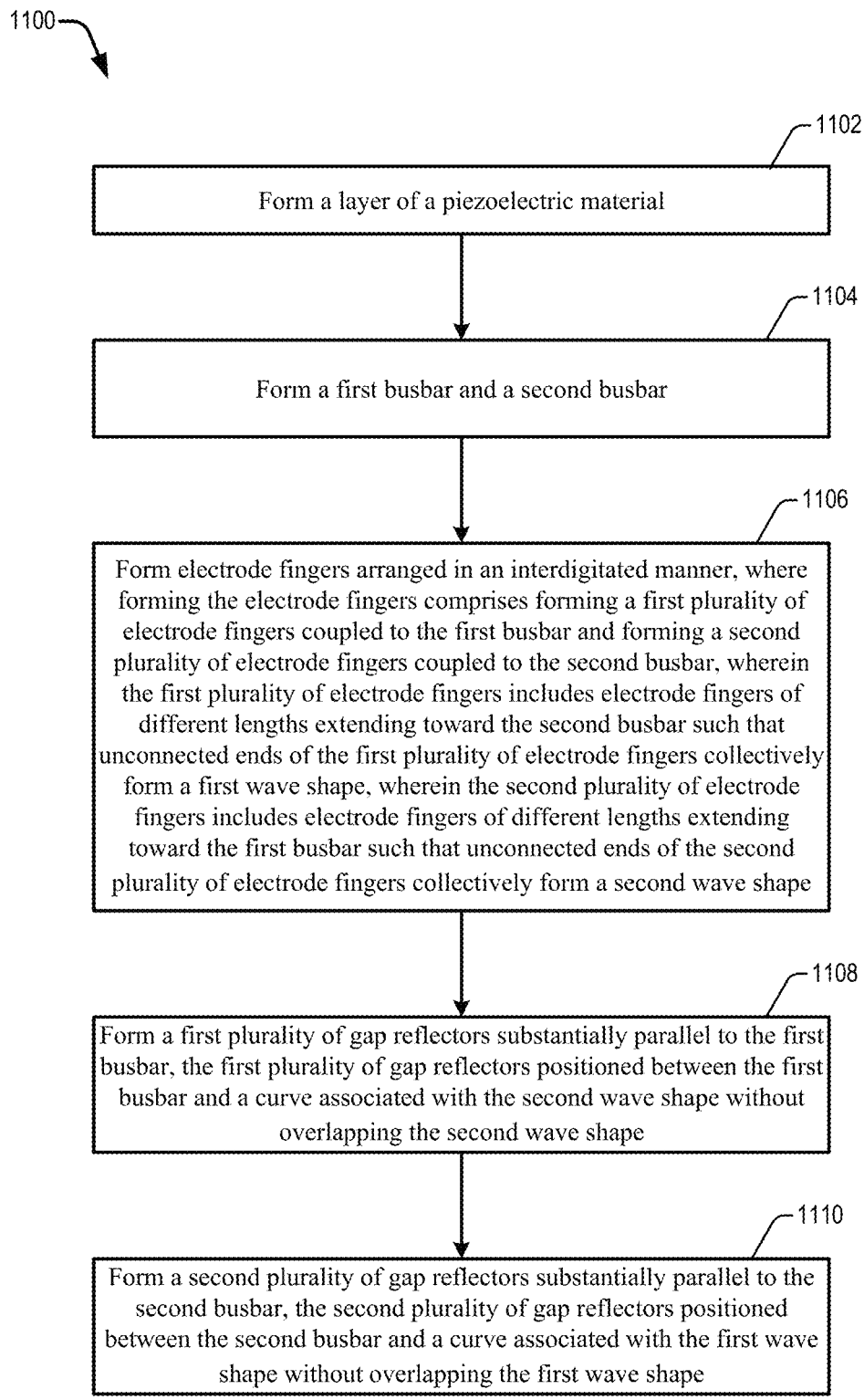
FIG. 11 is a flow chart illustrating an example of a method for filtering a signal in a wireless communication apparatus for a multi-band system in accordance with examples described herein.

FIG. 11 is a flow diagram describing an example of the operation of a method 1100 for operation of a wireless communication apparatus with one or more electroacoustic resonators having harmonic suppression in accordance with aspects described herein. In some aspects, the described operations can be performed by a device including a memory and processing circuitry coupled to the memory and configured to perform the operations of the method 1100. In some aspects, the method 1100 can be embodied as instructions stored in a non-transitory computer readable storage medium that, when executed by processing circuitry (e.g., control circuitry) of a device, cause the device to perform the operations of method 1100 described below. The blocks in the method 1100 can be performed in or out of the order shown, and in some embodiments, can be performed at least in part in parallel.

Method 1100 includes block 1102, which involves forming a layer of a piezoelectric material.

Blocks 1104 through 1110 involve forming an electrode structure on or above the piezoelectric material. Such an electrode structure and associated substrates that can further be formed as part of the method 1100 can be similar to the structures described in FIGS. 1A through 3B above.

The method 1100 includes block 1104, which involves forming a first busbar and a second busbar.

The method 1100 includes block 1106, which involves forming electrode fingers arranged in an interdigitated manner, where forming the electrode fingers comprises forming a first plurality of electrode fingers coupled to the first busbar and forming a second plurality of electrode fingers coupled to the second busbar, wherein the first plurality of electrode fingers includes electrode fingers of different lengths extending toward the second busbar such that unconnected ends of the first plurality of electrode fingers collectively form a first wave shape, wherein the second plurality of electrode fingers includes electrode fingers of different lengths extending toward the first busbar such that unconnected ends of the second plurality of electrode fingers collectively form a second wave shape.

The method 1100 includes block 1108, which involves forming a first plurality of gap reflectors substantially parallel to the first busbar, the first plurality of gap reflectors positioned between the first busbar and a curve associated with the second wave shape without overlapping the second wave shape.

The method 1100 includes block 1110, which involves forming a second plurality of gap reflectors substantially parallel to the second busbar, the second plurality of gap reflectors positioned between the second busbar and a curve associated with the first wave shape without overlapping the first wave shape.

Additional operations of the method 1100 or other similar aspects can involve formation of any structure described herein, including formation of dielectric or trimmed mass structures to modify the electroacoustic resonance with a trap structure as described herein, or any other such structures. The method 1100 or other similar aspects can additionally involve repeated blocks or intervening blocks for formation of other elements in a complex apparatus (e.g., as part of a system on a chip or other devices integrated with an electroacoustic resonator).

FIG. 12 is a functional block diagram of a wireless communication apparatus configured for OAM multiplexing in accordance with aspects described herein. The apparatus 1200 comprises means 1202 for forming a layer of a piezoelectric material. The means 1202 can include materials manufacturing devices for forming the layer on a substrate or any other stack of materials as described above. The apparatus 1200 then further includes means 1204 for forming an electrode structure on or above the piezoelectric material formed by the means 1202. The electrode structure comprises a first busbar; a second busbar parallel to the first busbar; a first plurality of electrode fingers coupled to the first busbar and extending in a first direction towards the second busbar without touching the second busbar, each of the first plurality of electrode fingers having a first end coupled to the first busbar and a second end, and each of the first plurality of electrode fingers extending a different distance toward the second busbar relative to adjacent electrode fingers of the first plurality of electrode fingers such that the second end of each of the first plurality of electrode fingers collectively form a first wave shape; a second plurality of electrode fingers coupled to the second busbar and extending in a second direction toward the first busbar without touching the first busbar, each of the second plurality of electrode fingers having a first end coupled to the second busbar and a second end, and each of the second plurality of electrode fingers extending a different distance toward the first busbar relative to adjacent electrode fingers of the second plurality of electrode fingers such that the second end of each of the second plurality of electrode fingers collectively form a second wave shape, wherein the first plurality of electrode fingers and the second plurality of electrode fingers are interleaved; a first plurality of gap reflectors substantially parallel to the first busbar, the first plurality of gap reflectors positioned between the first busbar and a curve associated with the second wave shape; and a second plurality of gap reflectors substantially parallel to the second busbar, the second plurality of gap reflectors positioned between the second busbar and a curve associated with the first wave shape.

The apparatus 1200 can further include means for forming any structure described in accordance with any aspect herein, including fabrication systems for forming or otherwise generating any substrate layer, piezoelectric layer, metal layer, dielectric layer, etc., described herein.

Additional illustrative aspects of the disclosure include:

Aspect 1. An electroacoustic resonator comprising: a first busbar; a second busbar parallel to the first busbar; a first plurality of electrode fingers coupled to the first busbar and extending in a first direction towards the second busbar without touching the second busbar, each of the first plurality of electrode fingers having a first end coupled to the first busbar and a second end, and each of the first plurality of electrode fingers extending a different distance toward the second busbar relative to adjacent electrode fingers of the first plurality of electrode fingers such that the second end of each of the first plurality of electrode fingers collectively form a first wave shape; a second plurality of electrode fingers coupled to the second busbar and extending in a second direction toward the first busbar without touching the first busbar, each of the second plurality of electrode fingers having a first end coupled to the second busbar and a second end, and each of the second plurality of electrode fingers extending a different distance toward the first busbar relative to adjacent electrode fingers of the second plurality of electrode fingers such that the second end of each of the second plurality of electrode fingers collectively form a second wave shape, wherein the first plurality of electrode fingers and the second plurality of electrode fingers are interleaved; a first plurality of gap reflectors substantially parallel to the first busbar, the first plurality of gap reflectors positioned between the first busbar and a curve associated with the second wave shape; and a second plurality of gap reflectors substantially parallel to the second busbar, the second plurality of gap reflectors positioned between the second busbar and a curve associated with the first wave shape.

Aspect 2. The electroacoustic resonator of Aspect 1, wherein: the first plurality of electrode fingers comprise a first weighted section proximate to the first end of each of the first plurality of electrode fingers; and the second plurality of electrode fingers comprise a second weighted section proximate to the first end of each of the second plurality of electrode fingers.

Aspect 3. The electroacoustic resonator of Aspects 2, wherein: the first weighted section proximate to the first end of each of the first plurality of electrode fingers is positioned on the curve associated with the second wave shape; and the first weighted section proximate to the first end of each of the second plurality of electrode fingers is positioned on the curve associated with the first wave shape.

Aspect 4. The electroacoustic resonator of any of Aspects 1 to 3, wherein: each electrode finger of the first plurality of electrode fingers comprises a second weighted section at the second end; and each electrode finger of the second plurality of electrode fingers comprises the second weighted section at the second end.

Aspect 5. The electroacoustic resonator of Aspect 4, wherein the first weighted section and the second weighted section of each of the first plurality of electrode fingers and the first weighted section and the second weighted section of each of the second plurality of electrode fingers each comprise a respective area of additional thickness compared with a respective center track portion of each corresponding electrode finger.

Aspect 6. The electroacoustic resonator of any of Aspects 4 to 5, wherein the first weighted section and the second weighted section of each of the first plurality of electrode fingers and the first weighted section and the second weighted section of each of the second plurality of electrode fingers each comprise a respective area of additional finger width compared with a respective center track portion of each corresponding electrode finger.

Aspect 7. The electroacoustic resonator of any of Aspects 1 to 6, where the curve associated with the first wave shape and the curve associated with the second wave shape each comprises at least one of a cosine curve or a sine curve; and wherein the curve associated with the first wave shape is offset from the curve associated with the second wave shape to provide a difference in overlapping finger length.

Aspect 8. The electroacoustic resonator of any of Aspects 1 to 7, wherein a period of the curve associated with the first wave shape and a period of the curve associated with the second wave shape each include a number of electrode fingers from 10 to 50.

Aspect 9. The electroacoustic resonator of any of Aspects 1 to 8, further comprising: a first weighted section defined by a dielectric layer or first trimmed segments proximate to the first end of each of the first plurality of electrode fingers; and a second weighted section defined by the dielectric layer or second trimmed segments proximate to the first end of each of the second plurality of electrode fingers.

Aspect 10. The electroacoustic resonator of any of Aspects 1 to 9, wherein the curve associated with the first wave shape and the curve associated with the second wave shape are each periodic with a shared period that repeats every 20 electrode fingers.

Aspect 11. The electroacoustic resonator of any of Aspects 1 to 10, wherein the curve associated with the second wave shape and the curve associated with the first wave shape are a same wave shape shifted out of phase to provide a change in overlapping finger length.

Aspect 12. The electroacoustic resonator of any of Aspects 1 to 11, wherein the first plurality of electrode fingers, the second plurality of electrode fingers, the first plurality of gap reflectors, and the second plurality of gap reflectors are in a metal layer having a metallization ratio between 0.5 and 0.55.

Aspect 13. The electroacoustic resonator of any of Aspects 1 to 12, wherein: the first plurality of gap reflectors each comprise a metal bar parallel to the first busbar and transverse across the first plurality of electrode fingers and coupled to at least a portion of the first plurality of electrode fingers; and the second plurality of gap reflectors each comprise a metal bar parallel to the second busbar and transverse across the second plurality of electrode fingers and coupled to at least a portion of the second plurality of fingers.

Aspect 14. The electroacoustic resonator of any of Aspects 1 to 12, wherein the first plurality of gap reflectors comprises a metal bar parallel to the first busbar and transverse across the first plurality of electrode fingers in a shared metallization layer with the first plurality of electrode fingers, the metal bar having a first break and a second break at adjacent electrode fingers of the first plurality of electrode fingers to create a floating gap reflector at an extension of a line of an electrode finger of the second plurality of electrode fingers between the adjacent electrode fingers of the first plurality of electrode fingers.

Aspect 15. The electroacoustic resonator of any of Aspects 1 to 12, wherein the first plurality of gap reflectors comprises a plurality of metal bars parallel to the first busbar and transverse across the first plurality of electrode fingers in a shared metallization layer with the first plurality of electrode fingers, one or more metal bars of the plurality of metal bars having a first break and a second break at adjacent electrode fingers of the first plurality of electrode fingers to create one or more floating gap reflectors at an extension of a line of an electrode finger of the second plurality of electrode fingers between the adjacent electrode fingers of the first plurality of electrode fingers at lines of the plurality of metal bars closest to the electrode finger of the second plurality of electrode fingers.

Aspect 16. The electroacoustic resonator of any of Aspects 1 to 15, further comprising: a first end reflector at a first track end, the first end reflector comprising reflector fingers extending in a perpendicular direction from the first busbar to the second busbar; a third plurality of electrode fingers coupled to the first busbar between the first plurality of electrode fingers or the second plurality of electrode fingers and the first end reflector, the third plurality of electrode fingers extending in the perpendicular direction towards the second busbar without touching the second busbar; and a fourth plurality of electrode fingers coupled to the second busbar between the first plurality of electrode fingers or the second plurality of electrode fingers and the first end reflector, the fourth plurality of electrode fingers extending in the perpendicular direction towards the first busbar without touching the first busbar, wherein the third plurality of electrode fingers are interleaved with the fourth plurality of electrode fingers.

Aspect 17. The electroacoustic resonator of Aspects 16, wherein: the third plurality of electrode fingers each further comprise a first weighted section, wherein each first weighted section of the third plurality of electrode fingers is approximately equidistant along a corresponding electrode finger from the first busbar; and the fourth plurality of electrode fingers each further comprise a first weighted section, wherein each first weighted section of the fourth plurality of electrode fingers is approximately equidistant along the corresponding electrode finger from the second busbar.

Aspect 18. The electroacoustic resonator of any of Aspects 16 to 17, wherein: the first plurality of gap reflectors does not extend into an area between each first weighted section of the third plurality of electrode fingers and the first busbar; and the second plurality of gap reflectors does not extend into an area between each first weighted section of the fourth plurality of electrode fingers and the second busbar.

Aspect 19A. The electroacoustic resonator of any of Aspects 1 to 18, wherein the electroacoustic resonator is part of a transmission path of a wireless communication device.

Aspect 19B. The electroacoustic resonator of any of Aspects 1 to 19A, wherein the wireless communication device further comprises: an antenna; an amplifier; a first antenna path coupled between the first busbar and the antenna; and a first transmission path coupled from an output of the amplifier to the second busbar.

Aspect 20. The electroacoustic resonator of any of Aspects 1-19B, further comprising a piezoelectric layer, wherein the first plurality of electrode fingers and the second plurality of electrode fingers are formed on the piezoelectric layer.

Aspect 21. The electroacoustic resonator of any of Aspects 1 to 20, wherein the first plurality of gap reflectors comprises gap reflectors having different lengths.

Aspect 22. The electroacoustic resonator of Aspects 21, wherein the different lengths of the first plurality of gap reflectors is defined by the curve associated with the second wave shape.

Aspect 23. An electroacoustic resonator comprising: a first busbar; a second busbar parallel to the first busbar; a plurality of electrode fingers, wherein electrode fingers coupled to the first busbar are interleaved with electrode fingers coupled to the second busbar to form an electroacoustic interdigital transducer, and wherein adjacent electrode fingers of the plurality of electrode fingers attached to a same busbar extend a different distance towards an opposite busbar; a first plurality of gap reflectors parallel to the first busbar, the first plurality of gap reflectors positioned between the first busbar and the electrode fingers coupled to the second busbar; and a second plurality of gap reflectors parallel to the second busbar, the second plurality of gap reflectors positioned between the second busbar and the electrode fingers coupled to the first busbar.

Aspect 24. The electroacoustic resonator of Aspect 23, wherein the electrode fingers coupled to the first busbar each comprise a first end and a second end and extend perpendicular from the first busbar toward the second busbar, wherein the first ends are coupled to the first busbar, wherein the second ends extend perpendicular from the first busbar towards the second busbar, and wherein the second ends collectively form a wave shape.

Aspect 25. The electroacoustic resonator of any of Aspects 23 to 24, wherein the wave shape is a triangle wave shape.

Aspect 26. An apparatus comprising: a first busbar; a second busbar parallel to the first busbar; a plurality of electrode fingers, wherein electrode fingers coupled to the first busbar are interleaved with electrode fingers coupled to the second busbar to form an electroacoustic interdigital transducer, and wherein electrode fingers of the plurality of electrode fingers extend a different distance towards an opposite busbar such that ends of the plurality of electrode fingers nearest the opposite busbar form wave shapes; a first plurality of gap reflectors parallel to the first busbar, the first plurality of gap reflectors positioned in a first barrier region between the first busbar and the electrode fingers coupled to the second busbar; and a second plurality of gap reflectors parallel to the second busbar, the second plurality of gap reflectors positioned in a second barrier region between the second busbar and the electrode fingers coupled to the first busbar.

Aspect 27. A method for forming an electroacoustic device, comprising: forming a layer of a piezoelectric material; and forming an electrode structure on or above the piezoelectric material, forming the electrode structure comprising: forming a first busbar and a second busbar; where forming the electrode fingers comprises forming a first plurality of electrode fingers coupled to the first busbar and forming a second plurality of electrode fingers coupled to the second busbar, wherein the first plurality of electrode fingers includes electrode fingers of different lengths extending toward the second busbar such that unconnected ends of the first plurality of electrode fingers collectively form a first wave shape, wherein the second plurality of electrode fingers includes electrode fingers of different lengths extending toward the first busbar such that unconnected ends of the second plurality of electrode fingers collectively form a second wave shape; forming a first plurality of gap reflectors substantially parallel to the first busbar, the first plurality of gap reflectors positioned between the first busbar and a curve associated with the second wave shape without overlapping the second wave shape; and forming a second plurality of gap reflectors substantially parallel to the second busbar, the second plurality of gap reflectors positioned between the second busbar and a curve associated with the first wave shape without overlapping the first wave shape.

Aspect 28. The method of Aspect 27, wherein forming the electrode structure further comprising: forming a first trap by forming first weighted sections where the electrode fingers are positioned on the first wave shape; and forming a second trap by forming second weighted sections where the electrode fingers are positioned on the second wave shape.

Aspect 29. The method of any of Aspects 27 to 28, wherein the first weighted sections and the second weighted sections are formed with an additional finger width.

Aspect 30. The method of any of Aspects 27 to 28, wherein the first weighted sections and the second weighted sections are formed with material from a dielectric layer.

Aspect 31. A method for transmitting or receiving wireless signals using any apparatus above.

Aspect 32. A non-transitory computer readable medium comprising instructions that, when executed by a wireless communication device, causes the wireless communication device to transmit or receive signals using any apparatus or method described above.

Aspect 33. An apparatus comprising means for performing any operation described above.

Figure 13:
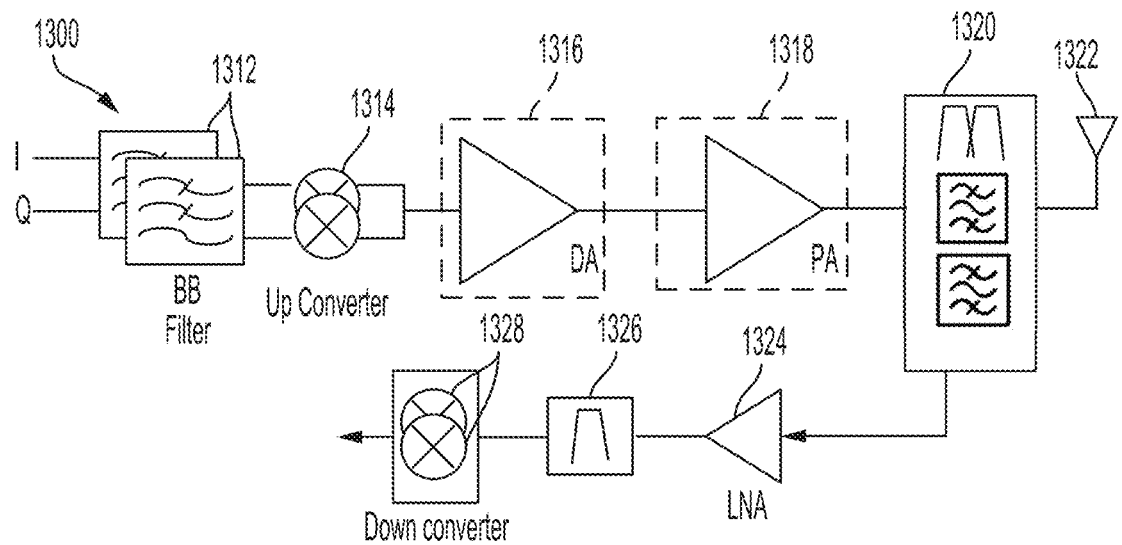
FIG. 13 illustrates a transceiver path that can include an electroacoustic resonator with harmonic suppression, in accordance with aspects described herein.

FIG. 13 is a functional block diagram of at least a portion of an example of a simplified wireless transceiver circuit 1300 in which a wireless communication apparatus having filters with harmonic suppression in accordance with aspects described above may be employed. The transceiver circuit 1300 is configured to receive signals/information for transmission (shown as I and Q values) which is provided to one or more base band filters 1312. The filtered output is provided to one or more mixers 1314. The output from the one or more mixers 1314 is provided to a driver amplifier 1316 whose output is provided to a power amplifier 1318 to produce an amplified signal for transmission. The amplified signal is output to the antenna 1322 through one or more filters 1320 (e.g., duplexers if used as a frequency division duplex transceiver or other filters). The one or more filters 1320 may include any filter circuit described herein, which can include one or more resonators in accordance with the details of the above description. The antenna 1322 may be used for both wirelessly transmitting and receiving data. The transceiver circuit 1300 includes a receive path through the one or more filters 1320 to be provided to a low noise amplifier (LNA) 1324 and a further filter 1326 and then down-converted from the receive frequency to a baseband frequency through one or more mixer circuits 1328 before the signal is further processed (e.g., provided to an analog digital converter and then demodulated or otherwise processed in the digital domain). There may be separate filters for the receive circuit (e.g., may have a separate antenna or have separate receive filters) that may be implemented using any filter circuit described herein.

Figure 14:
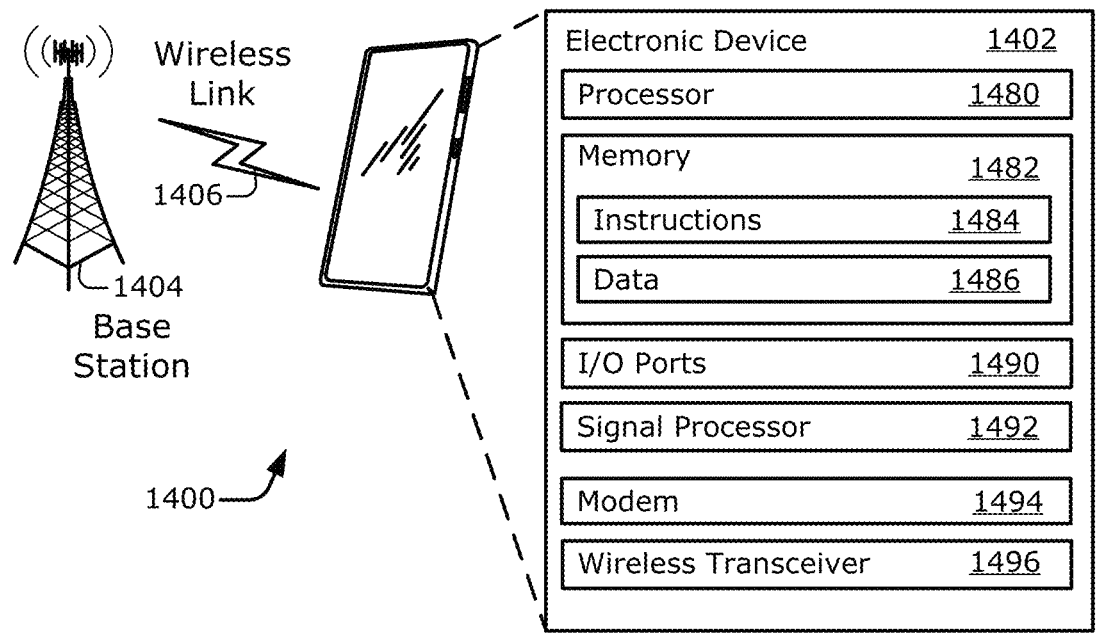
FIG. 14 is a diagram of an environment that includes a wireless communication device that can include a resonator with harmonic suppression for improved performance, in accordance with aspects described herein.

FIG. 14 is a diagram of an environment 1400 that includes an electronic device 1402 that includes a wireless transceiver 1496 such as the transceiver circuit 1300 of FIG. 13. In the environment 1400, the electronic device 1402 communicates with a base station 1404 through a wireless link 1406. As shown, the electronic device 1402 is depicted as a smart phone. However, the electronic device 1402 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1404 communicates with the electronic device 1402 via the wireless link 1406, which may be implemented as any suitable type of wireless link. Although depicted as a base station tower of a cellular radio network, the base station 1404 may represent or be implemented as another device, such as a satellite, terrestrial broadcast tower, access point, peer to peer device, mesh network node, fiber optic line, another electronic device generally as described above, and so forth. Hence, the electronic device 1402 may communicate with the base station 1404 or another device via a wired connection, a wireless connection, or a combination thereof. The wireless link 1406 can include a downlink of data or control information communicated from the base station 1404 to the electronic device 1402 and an uplink of other data or control information communicated from the electronic device 1402 to the base station 1404. The wireless link 1406 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1402 includes a processor 1480 and a memory 1482. The memory 1482 may be or form a portion of a computer readable storage medium. The processor 1480 may include any type of processor, such as an application processor or a multi-core processor, that is configured to execute processor-executable instructions (e.g., code) stored by the memory 1482. The memory 1482 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1482 is implemented to store instructions 1484, data 1486, and other information of the electronic device 1402, and thus when configured as or part of a computer readable storage medium, the memory 1482 does not include transitory propagating signals or carrier waves.

The electronic device 1402 may also include input/output ports 1490. The I/O ports 1490 enable data exchanges or interaction with other devices, networks, or users or between components of the device.

The electronic device 1402 may further include a signal processor (SP) 1492 (e.g., such as a digital signal processor (DSP)). The signal processor 1492 may function similar to the processor and may be capable executing instructions and/or processing information in conjunction with the memory 1482.

For communication purposes, the electronic device 1402 also includes a modem 1494, a wireless transceiver 1496, and an antenna (not shown). The wireless transceiver 1496 provides connectivity to respective networks and other electronic devices connected therewith using radio-frequency (RF) wireless signals and may include the transceiver circuit 1300 of FIG. 13. The wireless transceiver 1496 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The various operations of methods described above may be performed by any suitable means capable of performing the corresponding functions. The means may include various hardware and/or software component(s) and/or module (s), including, but not limited to a circuit, an application-specific integrated circuit (ASIC), or processor. As part of such operations, methods described above can further include blocks to perform any additional functions described for operating an apparatus with harmonic suppression in accordance with examples described herein.

By way of example, an element, or any portion of an element, or any combination of elements described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An electroacoustic resonator comprising:
a first busbar extending in a first direction;
a second busbar extending in the lateral direction;
a first plurality of electrode fingers coupled to the first busbar and extending in a second direction towards the second busbar without touching the second busbar, each of the first plurality of electrode fingers having a first end coupled to the first busbar and a second end, and each of the first plurality of electrode fingers extending a different distance toward the second busbar relative to adjacent electrode fingers of the first plurality of electrode fingers such that the second end of each of the first plurality of electrode fingers collectively form a first wave shape;
a second plurality of electrode fingers coupled to the second busbar and extending in a third direction toward the first busbar without touching the first busbar, each of the second plurality of electrode fingers having a first end coupled to the second busbar and a second end, and each of the second plurality of electrode fingers extending a different distance toward the first busbar relative to adjacent electrode fingers of the second plurality of electrode fingers such that the second end of each of the second plurality of electrode fingers collectively form a second wave shape, wherein the first plurality of electrode fingers and the second plurality of electrode fingers are interleaved;
a first plurality of gap reflectors substantially parallel to the first busbar, the first plurality of gap reflectors positioned between the first busbar and a curve associated with the second wave shape, wherein the first plurality of gap reflectors comprises a first group of at least one gap reflector having a first length in the first direction and a second group of at least one gap reflector having a second length different from the first length in the first direction; and
a second plurality of gap reflectors substantially parallel to the second busbar, the second plurality of gap reflectors positioned between the second busbar and a curve associated with the first wave shape, wherein the second plurality of gap reflectors comprises a third group of at least one gap reflector having the first length in the first direction and a fourth group of at least one gap reflector having the second length in the first direction.

2. The electroacoustic resonator of claim 1, wherein:
the first plurality of electrode fingers comprise a first weighted section proximate to the first end of each of the first plurality of electrode fingers; and
the second plurality of electrode fingers comprise a first weighted section proximate to the first end of each of the second plurality of electrode fingers.

3. The electroacoustic resonator of claim 2, wherein:
the first weighted section proximate to the first end of each of the first plurality of electrode fingers is positioned on the curve associated with the second wave shape; and
the first weighted section proximate to the first end of each of the second plurality of electrode fingers is positioned on the curve associated with the first wave shape.

4. The electroacoustic resonator of claim 3, wherein:
each electrode finger of the first plurality of electrode fingers comprises a second weighted section at the second end; and
each electrode finger of the second plurality of electrode fingers comprises a second weighted section at the second end.

5. The electroacoustic resonator of claim 4, wherein the first weighted section and the second weighted section of each of the first plurality of electrode fingers and the first weighted section and the second weighted section of each of the second plurality of electrode fingers each comprise a respective area of additional thickness compared with a respective center track portion of each corresponding electrode finger.

6. The electroacoustic resonator of claim 4, wherein the first weighted section and the second weighted section of each of the first plurality of electrode fingers and the first weighted section and the second weighted section of each of the second plurality of electrode fingers each comprise a respective area of additional finger width compared with a respective center track portion of each corresponding electrode finger.

7. The electroacoustic resonator of claim 1, further comprising:
a first end reflector at a first track end, the first end reflector comprising reflector fingers extending in a perpendicular direction from the first busbar to the second busbar;
a third plurality of electrode fingers coupled to the first busbar between the first plurality of electrode fingers or the second plurality of electrode fingers and the first end reflector, the third plurality of electrode fingers extending in the perpendicular direction towards the second busbar without touching the second busbar; and
a fourth plurality of electrode fingers coupled to the second busbar between the first plurality of electrode fingers or the second plurality of electrode fingers and the first end reflector, the fourth plurality of electrode fingers extending in the perpendicular direction towards the first busbar without touching the first busbar, wherein the third plurality of electrode fingers are interleaved with the fourth plurality of electrode fingers.

8. The electroacoustic resonator of claim 7, wherein:
the third plurality of electrode fingers each further comprise a first weighted section, wherein each first weighted section of the third plurality of electrode fingers is approximately equidistant along a corresponding electrode finger from the first busbar; and
the fourth plurality of electrode fingers each further comprise a first weighted section, wherein each first weighted section of the fourth plurality of electrode fingers is approximately equidistant along the corresponding electrode finger from the second busbar.

9. The electroacoustic resonator of claim 8, wherein:
the first plurality of gap reflectors does not extend into an area between each first weighted section of the third plurality of electrode fingers and the first busbar; and
the second plurality of gap reflectors does not extend into an area between each first weighted section of the fourth plurality of electrode fingers and the second busbar.

10. The electroacoustic resonator of claim 1, wherein the first plurality of gap reflectors comprises gap reflectors having different lengths.

11. The electroacoustic resonator of claim 10, wherein the different lengths of the first plurality of gap reflectors is defined by the curve associated with the second wave shape.

12. The electroacoustic resonator of claim 1, wherein the curve associated with the first wave shape and the curve associated with the second wave shape each comprises at least one of a cosine curve or a sine curve; and
wherein the curve associated with the first wave shape is offset from the curve associated with the second wave shape to provide a difference in overlapping finger length.

13. The electroacoustic resonator of claim 12, wherein a period of the curve associated with the first wave shape and a period of the curve associated with the second wave shape each include a number of electrode fingers from 10 to 50.

14. The electroacoustic resonator of claim 1, further comprising:
a first weighted section defined by a dielectric layer or first trimmed segments proximate to the first end of each of the first plurality of electrode fingers; and
a second weighted section defined by the dielectric layer or second trimmed segments proximate to the first end of each of the second plurality of electrode fingers.

15. The electroacoustic resonator of claim 1, wherein the curve associated with the first wave shape and the curve associated with the second wave shape are each periodic with a shared period that repeats every 20 electrode fingers.

16. The electroacoustic resonator of claim 1, wherein the curve associated with the second wave shape and the curve associated with the first wave shape are a same wave shape shifted out of phase to provide a change in overlapping finger length.

17. The electroacoustic resonator of claim 1, wherein the first plurality of electrode fingers, the second plurality of electrode fingers, the first plurality of gap reflectors, and the second plurality of gap reflectors are in a metal layer having a metallization ratio between 0.5 and 0.55.

18. The electroacoustic resonator of claim 1, wherein:
the first plurality of gap reflectors each comprise a metal bar parallel to the first busbar and transverse across the first plurality of electrode fingers and coupled to at least a portion of the first plurality of electrode fingers; and
the second plurality of gap reflectors each comprise a metal bar parallel to the second busbar and transverse across the second plurality of electrode fingers and coupled to at least a portion of the second plurality of electrode fingers.

19. The electroacoustic resonator of claim 1, wherein the first plurality of gap reflectors comprises a metal bar parallel to the first busbar and transverse across the first plurality of electrode fingers in a shared metallization layer with the first plurality of electrode fingers, the metal bar having a first break and a second break at adjacent electrode fingers of the first plurality of electrode fingers to create a floating gap reflector at an extension of a line of an electrode finger of the second plurality of electrode fingers between the adjacent electrode fingers of the first plurality of electrode fingers.

20. The electroacoustic resonator of claim 1, wherein the first plurality of gap reflectors comprises a plurality of metal bars parallel to the first busbar and transverse across the first plurality of electrode fingers in a shared metallization layer with the first plurality of electrode fingers, one or more metal bars of the plurality of metal bars having a first break and a second break at adjacent electrode fingers of the first plurality of electrode fingers to create one or more floating gap reflectors at an extension of a line of an electrode finger of the second plurality of electrode fingers between the adjacent electrode fingers of the first plurality of electrode fingers at lines of the plurality of metal bars closest to the electrode finger of the second plurality of electrode fingers.

21. The electroacoustic resonator of claim 1, wherein the electroacoustic resonator is part of a transmission path of a wireless communication device; and
wherein the wireless communication device further comprises:
an antenna;
an amplifier;
a first antenna path coupled between the first busbar and the antenna; and a first transmission path coupled from an output of the amplifier to the second busbar.

22. The electroacoustic resonator of claim 1, further comprising a piezoelectric layer, wherein the first plurality of electrode fingers and the second plurality of electrode fingers are formed on the piezoelectric layer.

23. An electroacoustic resonator comprising:
a first busbar extending in a first direction;
a second busbar extending in the first direction;
a plurality of electrode fingers, wherein electrode fingers coupled to the first busbar are interleaved with electrode fingers coupled to the second busbar to form an electroacoustic interdigital transducer, and wherein adjacent electrode fingers of the plurality of electrode fingers attached to a same busbar extend a different distance towards an opposite busbar;
   a first plurality of gap reflectors parallel to the first busbar, the first plurality of gap reflectors positioned between the first busbar and the electrode fingers coupled to the second busbar, wherein the first plurality of gap reflectors comprises a first group of at least one gap reflector having a first length in the first direction and a second group of at least one gap reflector having a second length different from the first length in the first direction; and
   a second plurality of gap reflectors parallel to the second busbar, the second plurality of gap reflectors positioned between the second busbar and the electrode fingers coupled to the first busbar, wherein the second plurality of gap reflectors comprises a third group of at least one gap reflector having the first length in the first direction of the second busbar and a fourth group of at least one gap reflector having the second length in the first direction.

24. The electroacoustic resonator of claim 23, wherein the electrode fingers coupled to the first busbar each comprise a first end and a second end and extend perpendicular from the first busbar toward the second busbar, wherein the first ends of the electrode fingers are coupled to the first busbar, wherein the second ends of the electrode fingers extend perpendicular from the first busbar towards the second busbar, and wherein the second ends collectively form a wave shape.

25. The electroacoustic resonator of claim 24, wherein the wave shape is a triangle wave shape.

26. An apparatus comprising:
a piezoelectric material; and
an electrode structure positioned on the piezoelectric material comprising:
   a first busbar extending in a first direction;
   a second busbar extending in the first direction;
   a plurality of electrode fingers, wherein electrode fingers coupled to the first busbar are interleaved with electrode fingers coupled to the second busbar to form an electroacoustic interdigital transducer, and wherein electrode fingers of the plurality of electrode fingers extend a different distance towards an opposite busbar such that ends of the plurality of electrode fingers nearest the opposite busbar form wave shapes;
   a first plurality of gap reflectors parallel to the first busbar, the first plurality of gap reflectors positioned in a first barrier region between the first busbar and the electrode fingers coupled to the second busbar, wherein the first plurality of gap reflectors comprises a first group of at least one gap reflector having a first length in the first direction and a second group of at least one gap reflector having a second length different from the first length in the first direction; and
   a second plurality of gap reflectors parallel to the second busbar, the second plurality of gap reflectors positioned in a second barrier region between the second busbar and the electrode fingers coupled to the first busbar, wherein the second plurality of gap reflectors comprises a third group of at least one gap reflector having the first length in the first direction and a fourth group of at least one gap reflector having the second length in the first direction.

27. A method for forming an electroacoustic device, comprising:
forming a layer of a piezoelectric material; and
forming an electrode structure on or above the piezoelectric material, forming the electrode structure comprising:
forming a first busbar and a second busbar to extend in a first direction;
forming electrode fingers arranged in an interdigitated manner, where forming the electrode fingers comprises forming a first plurality of electrode fingers coupled to the first busbar and forming a second plurality of electrode fingers coupled to the second busbar, wherein the first plurality of electrode fingers includes electrode fingers of different lengths extending toward the second busbar such that unconnected ends of the first plurality of electrode fingers collectively form a first wave shape, wherein the second plurality of electrode fingers includes electrode fingers of different lengths extending toward the first busbar such that unconnected ends of the second plurality of electrode fingers collectively form a second wave shape;
forming a first plurality of gap reflectors substantially parallel to the first busbar, the first plurality of gap reflectors positioned between the first busbar and a curve associated with the second wave shape without overlapping the second wave shape, wherein the first plurality of gap reflectors comprises a first group of at least one gap reflector having a first length in the first direction and a second group of at least one gap reflector having a second length different from the first length in the first direction; and
forming a second plurality of gap reflectors substantially parallel to the second busbar, the second plurality of gap reflectors positioned between the second busbar and a curve associated with the first wave shape without overlapping the first wave shape, wherein the second plurality of gap reflectors comprises a third group of at least one gap reflector having the first length in the first direction and a fourth group of at least one gap reflector having the second length in the first direction.

28. The method of claim 27, wherein forming the electrode structure further comprising:
forming a first trap by forming first weighted sections where the electrode fingers are positioned on the first wave shape; and
forming a second trap by forming second weighted sections where the electrode fingers are positioned on the second wave shape.

29. The method of claim 28, wherein the first weighted sections and the second weighted sections are formed with an additional finger width.

30. The method of claim 28, wherein the first weighted sections and the second weighted sections are formed with material from a dielectric layer.

\* \* \* \* \*